United States Patent [19]
Suzuki et al.

[11] Patent Number: 5,347,526
[45] Date of Patent: Sep. 13, 1994

[54] WAVELENGTH-TUNABLE SEMICONDUCTOR LASER

[75] Inventors: Nobuo Suzuki; Masaki Tohyama; Masaaki Onomura, all of Tokyo, Japan

[73] Assignee: Kabushiki Kaisha Toshiba, Kawasaki, Japan

[21] Appl. No.: 40,853

[22] Filed: Mar. 31, 1993

[30] Foreign Application Priority Data

Mar. 31, 1992 [JP] Japan .................................. 4-105671
Dec. 4, 1992 [JP] Japan .................................. 4-324551

[51] Int. Cl.$^5$ ............................................. H01S 3/10
[52] U.S. Cl. ....................................... 372/20; 372/34; 372/46; 372/50; 372/96
[58] Field of Search ...................... 372/96, 20, 50, 45, 372/46, 34

[56] References Cited

U.S. PATENT DOCUMENTS 5,187,717 2/1993 Horita et al. .......................... 372/96

FOREIGN PATENT DOCUMENTS 3-174791 7/1991 Japan .

OTHER PUBLICATIONS

Appl. Phys. Lett., vol. 57, No. 25, pp. 2632–2634, "Broad Wavelength Tunability in Gain-Levered Quantum Well Semiconductor Lasers" K. Y. Lau, Dec. 17, 1991.

*Primary Examiner*—James W. Davie
*Attorney, Agent, or Firm*—Oblon, Spivak, McClelland, Maier & Neustadt

[57] ABSTRACT

A wavelength-tunable semiconductor laser which comprises a semiconductor substrate having first and second major surfaces, a distribution-feedback resonator having an active layer and a cladding layer, formed on the first major surface of the substrate and shaped like a stripe, and a first section and a second section aligned along the length of the resonator, and electrodes formed on the first and second sections of the resonator, respectively, for controlling current densities in the first and second section independently. The laser is characterized in that temperature changes more in the first section than in the second section, due to changes in densities of currents injected into the first and second sections.

15 Claims, 17 Drawing Sheets

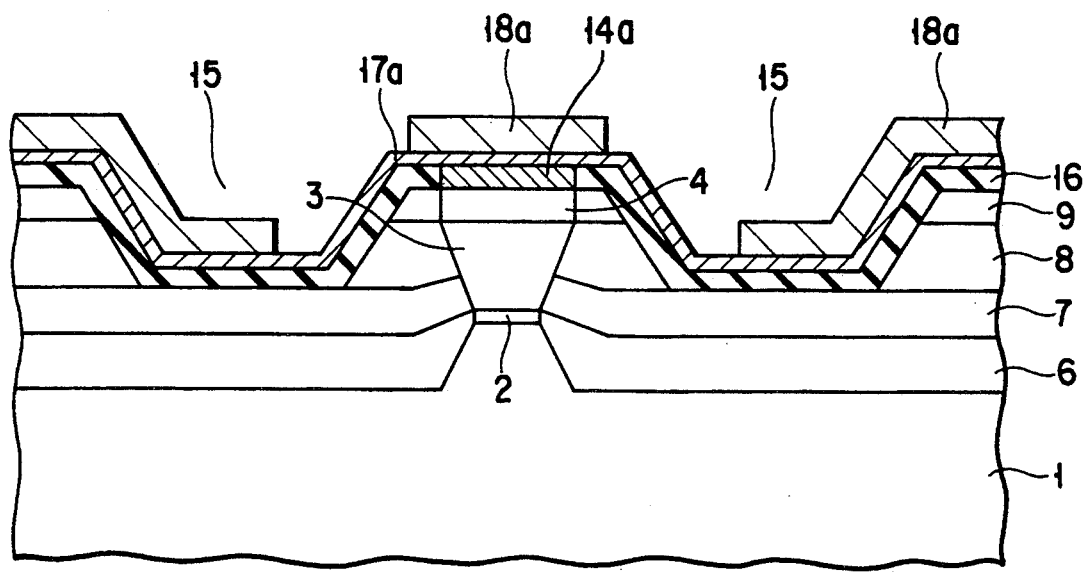
F I G. 7A
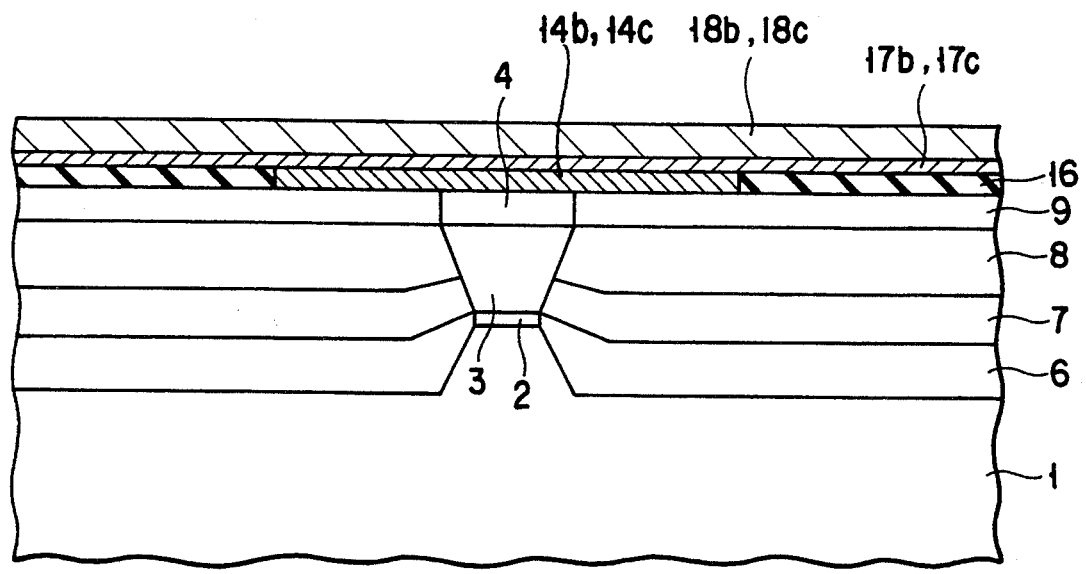
F I G. 7B

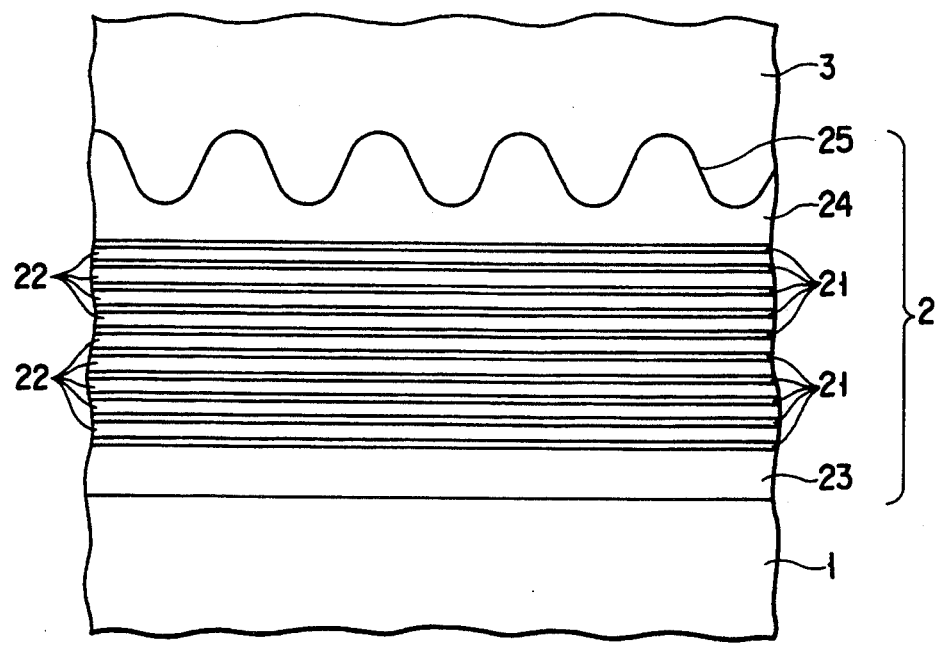
F I G. 8
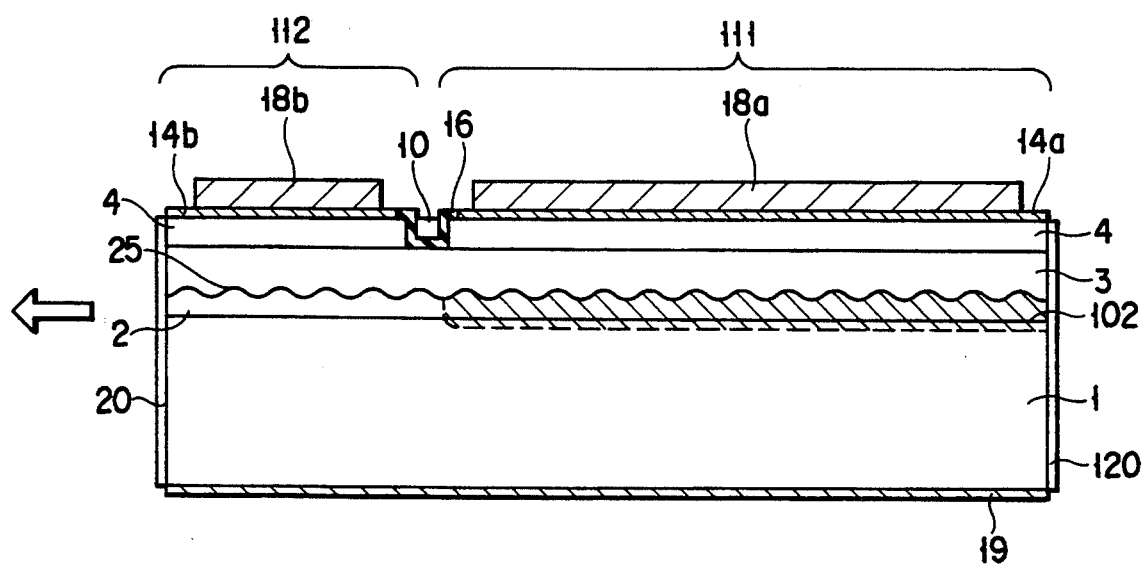
F I G. 9

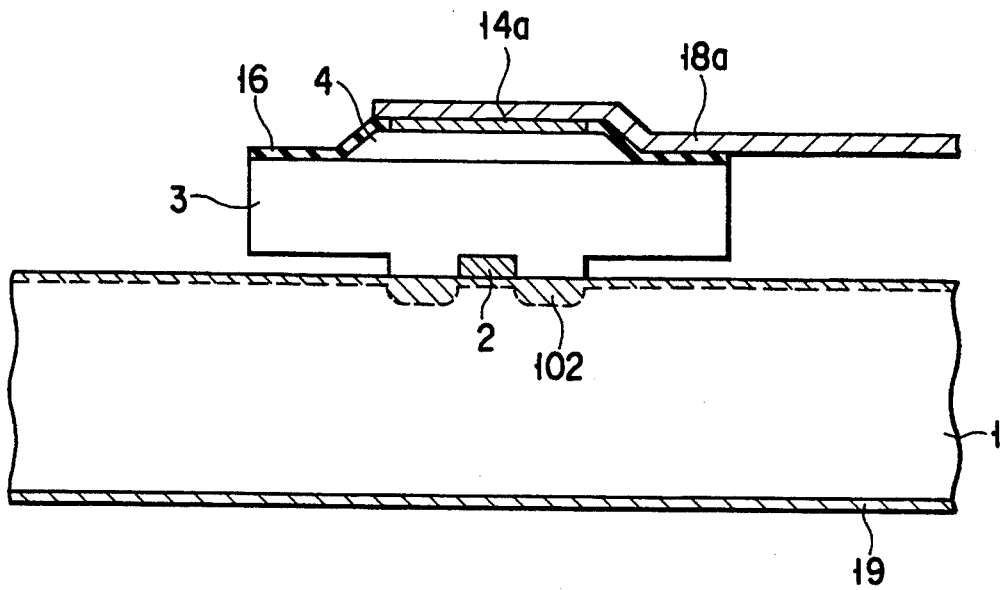
F I G. 10A
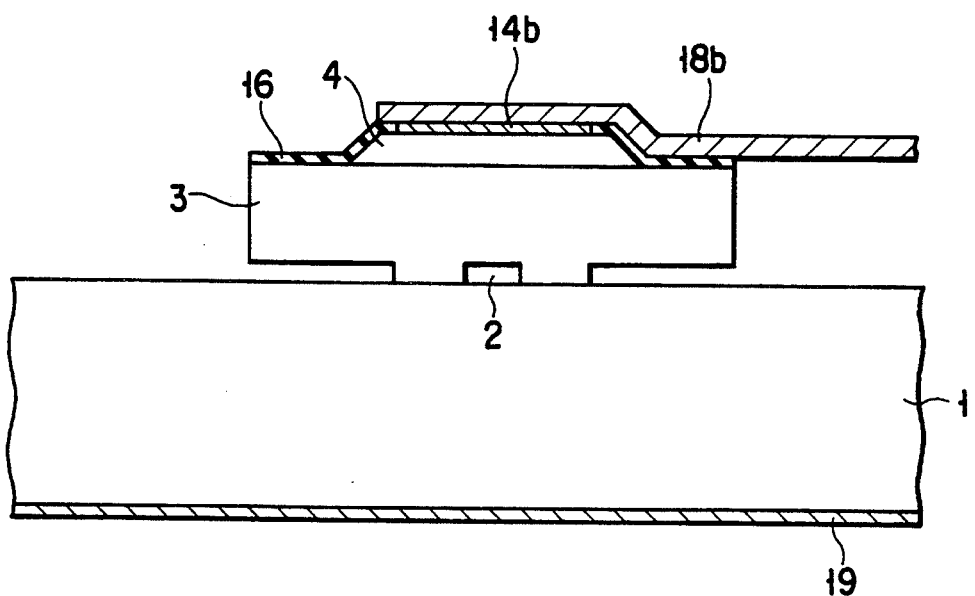
F I G. 10B

DISTANCE ALONG THE
LENGTH OF RESONATOR

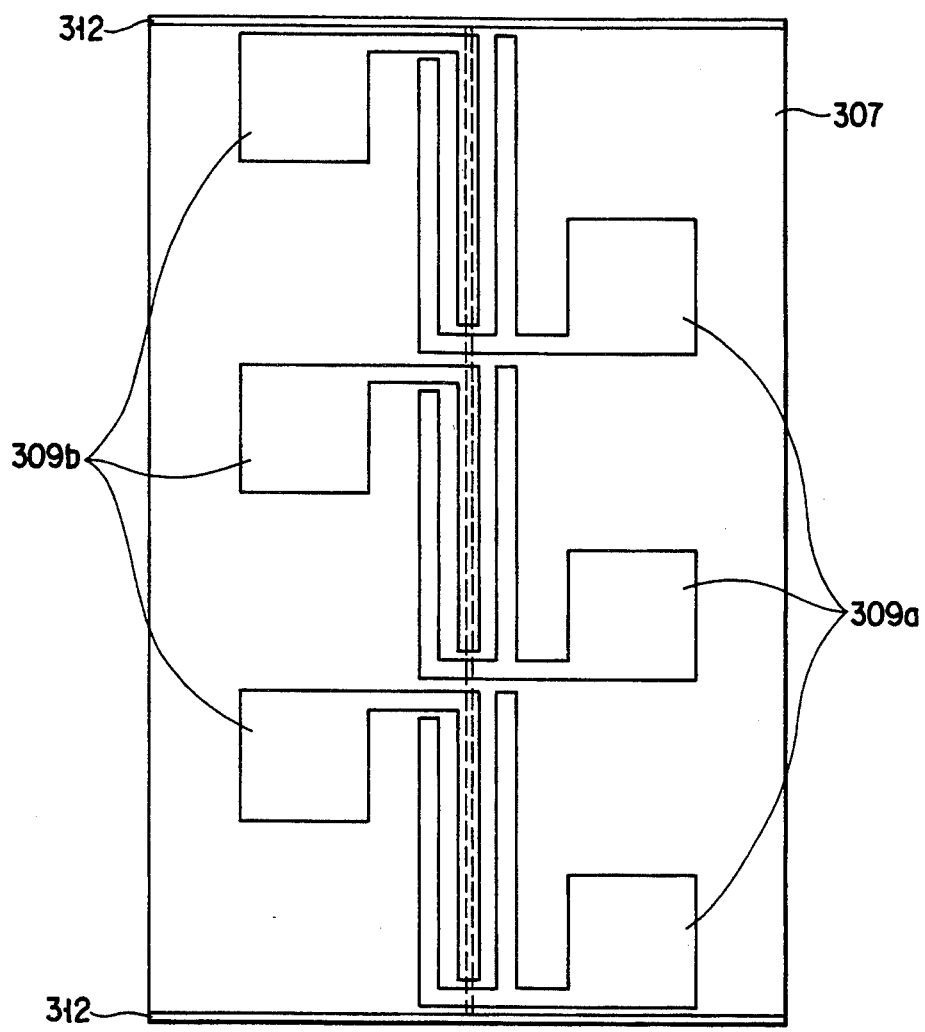
F I G. 21
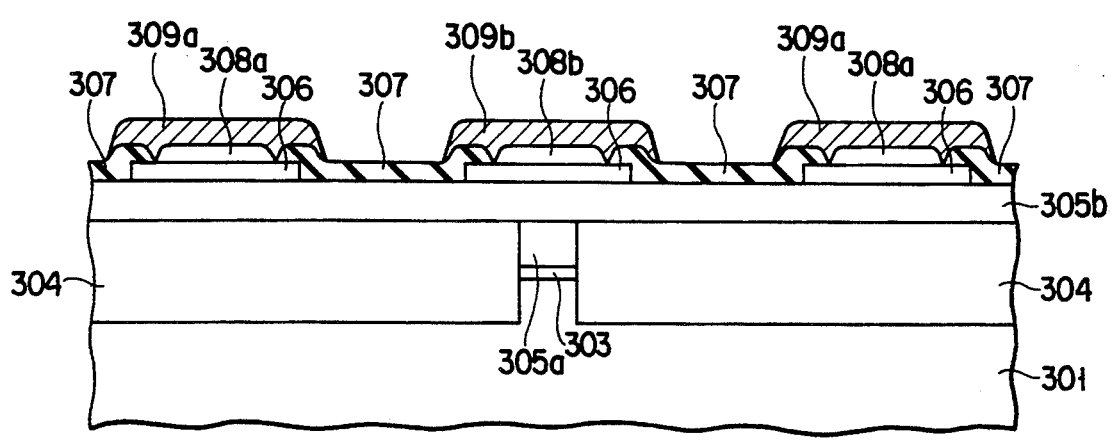
F I G. 22

WAVELENGTH-TUNABLE SEMICONDUCTOR LASER

BACKGROUND OF THE INVENTION

1. Field of the Invention

The present invention relates to a semiconductor laser which can be electrically tuned over an oscillation wavelength range, and more particularly to a wavelength-tunable semiconductor laser of multi-electrode DFB (Distributed Feedback) structure in which each region in a DFB resonator can be independently controlled by a plurality of electrode.

2. Description of the Related Art

In recent years, researches and development have been increasingly made in optical frequency division-multiplexing (optical FDM). Optical FDM can be applied to various fields, such as large-capacity optical communication, optical inter-connection, optical switching, and optical arithmetic operation. A semiconductor laser is being developed as a coherent light source for use in optical FDM is of the type which is compact and reliable and which can be electrically tuned over an oscillation wavelength.

For large-capacity FDM it is required that a semiconductor laser be developed which can be turned over a broad oscillation wavelength range. To multiplex many frequency channels in high density within the predetermined wavelength range, it is desirable that the frequency range occupied by each channel be narrowed. In particular, a coherent-light transmission system, which is a feasible optical FDM application, needs a light source which emits a light beam having a small spectral linewidth to obtain an electric signal from interference between a signal light beam and a locally-oscillated light beam.

Also under development is an external-cavity semiconductor laser which has a wavelength-selecting device outside a semiconductor chip. The external-cavity semiconductor laser, however, is not recommendable for use in optical FDM in view of its size, stability, price, and reliability. A monolithic wavelength tunable semiconductor laser is required to achieve optical FDM. The wavelength-tunable semiconductor lasers, now under research, are classified into the follow four types:

(1) Temperature-control type semiconductor laser,
(2) Multi-electrode distributed Bragg-reflection (DBR) semiconductor laser,
(3) Multi-electrode distributed feedback (DFB) semiconductor laser,
(4) Twin-guide semiconductor laser.

A temperature-control type semiconductor laser has a heating means located near the active region to raise the temperature of the active layer. Generally, the wavelength range of a semiconductor laser shifts to the long side as the temperature rises. This phenomenon is known as "red shift." The laser can therefore be turned over a broad wavelength range while a small linewidth is maintained. Since its active layer is heated considerably, however, the laser cannot be as reliable as is desired.

In a multi-electrode DBR semiconductor laser, carriers are injected into the Bragg reflection region, thereby changing the Bragg wavelength greatly. Certainly, the multi-electrode DBR laser can be tuned over a broad oscillation wavelength range. However, since carriers are injected into the Bragg wave guide which is passive, the internal carrier density varies. Consequently, this laser emits a beam having a linewidth as much as 10 MHz or more, and can hardly be used in a coherent-light transmission system. Further, the Bragg wavelength is changed, jumping over many modes, the multi-electrode DBR semiconductor laser can be merely continuously tuned but over a narrow oscillation wavelength range.

A multi-electrode DFB semiconductor laser has a several sections divided along a direction of a resonator. The balance of the carrier densities in those sections are changed, thereby varying the average carrier density. As a result, the oscillation wavelength of the laser is changed.

In the case of the 3-electrode phase-sifted DFB laser shown in FIG. 1 which has anti-reflection coatings on both faces, when a large current is uniformly injected into the laser, as indicated in FIG. 2A by the solid curve, light will concentrate near the phase-shifting section as shown in FIG. 2B by the solid curve. Induced emission at the phase-shifting section therefore increases, whereby the carrier density is lower at the center portion of the device than at the ends thereof, as is indicated in FIG. 2C by the solid curve. Due to the non-uniform carrier density (i.e., axial hole-burning), the average carrier density is higher than in the case where the current density is uniform along the axis of the device. The higher the average carrier density, the lower the refractive index, and the shorter the oscillation wavelength.

When more current is injected into the center portion of the laser than to the end portions thereof, as indicated in FIG. 2A by the broken curve, the carrier density is substantially uniform as is indicated in FIG. 2C by the broken curve. The average carrier density therefore decreases, whereby the device undergoes a red shift, or its wavelength range shifts to the long side. Since the entire region is active, its average carrier density does not varies so much at the time of current injection. A small linewidth can be therefore realized. However, since the average carrier density does not change so much, the changeable wavelength range is limited to about 2 nm only.

In a twin-guide semiconductor laser, the currents supplied to the active layer and the light-guiding layer (or the second active layer), which are closely laminated, are controlled independently. This device is, as it were, divided into layers in the direction of the thickness, as compared to the multi-electrode DBR or DFB laser which is divided into several sections in the axial direction. The device operates in a mode similar to the operating mode of a multi-electrode DBR laser if the waveguide layer, which is a passive element, is used, and in a mode similar to the operating mode of a multi-electrode DFB laser if the waveguide layer is replaced by a second active layer.

In both the multi-electrode DBR laser and the multi-electrode DFB laser, not only the above-mentioned carrier effect but also the heat effect much contributes to the changes in oscillation wavelength. In the laser shown in FIG. 1 and FIGS. 2A to 2C, too, the temperature rise caused by the current increase in the center portion greatly contributes to the red shift.

The multi-electrode DBR laser and the twin-guide semiconductor laser can hardly be applied to a coherent-light transmission system, since these lasers emit a beam whose spectrum linewidth is is not sufficiently small. Nor can the temperature-control type semiconductor laser be recommended for use in a coherent-light transmission system, since the laser is not so reliable as desired due to the heat applied to the active layer to change the oscillation wavelength. Therefore, the multi-electrode DFB semiconductor laser seems suitable for use in a coherent-light transmission system.

Technique called "gain-levering" is known as a method of enhancing the wavelength tunability of a multi-electrode DFB semiconductor laser. The principle of gain-levering is discussed in K. Y. Lau, Appl. Phys. Lett., Vol. 57(25), pp. 2632–2634 (December 1990). This technique will be summarized as follows, with reference to FIGS. 3 and 4.

FIG. 3 shows a gain-levered DFB quantum well semiconductor laser. FIG. 4 is a graph illustrating the relationship between carrier density and gain, which is observed with this gain-levered DFB quantum well laser. As is evident from FIG. 4, the laser has a high non-linearity since its gain saturates in the region having a high carrier density.

It is assumed that the operating points of the regions 1 and 2 of the laser are located at point A (uniformly excited condition) on the curve shown in FIG. 4. As the current injected into the region 1 is decreased, gradually lowering the carrier density in the region 1, the carrier density in the region 2 increases to maintain the gain at the initial value. As a result, the operating points of the regions 1 and 2 shift to points B1 and B2 as is illustrated in FIG. 4. Due to the non-linearity of the curve representing the relationship between the carrier density and the gain, the average carrier density of the laser increases as the operating points of the regions 1 and 2 shift from the point A (uniform excitation) to the points B1 and B2 (non-uniform excitation). The oscillation wavelength therefore shifts toward the short side. (That is, a blue shift takes places.) Due to the change in the current, the gain and the carrier density (i.e., the oscillation wavelength) greatly change in the regions 1 and 2, respectively. In view of this, the region 1 is considered as a gain-control region, and the region 2, as a wavelength control region.

If the excitation is rendered non-uniform by virtue of gain-lever effect, thus effecting a blue shift, however, not only the average carrier density but also the average current density will increase, inevitably raising the temperature of the laser. This temperature rise causes a red shift, which cancels out the blue shift. Consequently, the gain-levered DFB quantum well laser cannot be tuned over so broad a wavelength range as is expected.

In the case of a multi-electrode DFB semiconductor laser, the refractive-index distribution in the resonator varies with the carrier-density distribution in the resonator. Hence, the wavelength at which the laser requires a minimum threshold gain to oscillate does change. On the other hand, the change in the refractive-index distribution in the resonance alters the phase-matching condition. If the wavelength at which the laser requires a minimum threshold gain to oscillate always satisfies the phase-matching condition, it can be expected that the laser continues stable oscillating.

With any conventional multi-electrode DFB laser, however, it is difficult to simultaneously control the threshold-gain condition and the phase-matching condition. The conventional multi-electrode DFB laser oscillates stably but over a small oscillation wavelength range. In a three-electrode phase-shifted DFB laser, for example, when the current injected into the center section of the resonator is increased, while maintaining the currents injected into the end regions at a constant value, the refractive-index distribution along the length of the resonator varies, inevitably changing both the threshold-gain condition and the phase-matching condition. Such a mode jump as shown in FIG. 19 is therefore unavoidable. As a consequence, the wavelength range over which the laser can be tuned in one oscillation mode is limited to 1 nm or less.

The conventional multi-electrode DFB laser has another problem. As a current is injected into each region of the laser, not only the carrier density but also the temperature distributes non-uniformly. Due to the non-uniform carrier density distribution and the non-uniform temperature distribution, the refractive index, which depends on both the carrier density and the temperature, is not distributed uniformly, either. Because of these complex oscillation conditions, it is more difficult to control the operating mode of the multi-electrode DFB laser.

SUMMARY OF THE INVENTION

The object of the present invention is to provide a wavelength-tunable semiconductor laser of multi-electrode DFB structure, in which the mutual cancellation of the carrier effect and the heat effect is suppressed and which thereby has a broad tunable wavelength range.

According to the invention, there is provided a wavelength-tunable semiconductor laser which comprises: a semiconductor substrate; a distributed-feedback resonator having an active layer and a cladding layer, both formed on one surface of the substrate and shaped like stripes, and a first section and a second section aligned along the length of the resonator; and electrodes formed on the first and second sections of the resonator, respectively, for controlling current densities in the first and second section independently. The laser is characterized in that temperature change due to change in densities of currents injected into the first and second sections, is larger in the first section than in the second section.

Also, according to the invention, there is provided a wavelength-tunable semiconductor laser which comprises: a semiconductor substrate; a stripe-shaped active layer formed on said substrate; a diffraction grating extending along said stripe-shaped active layer; and a plurality of split electrodes, each consisting of first and second electrodes spaced apart from each other and located on the sides of said stripe-shaped active layer, respectively. This laser is characterized in that said first and second electrodes of each of said split electrodes are in a plane perpendicular to said stripe-shaped active layer, and inject currents into two portions of said active layer such that the temperatures of these portions change differently when the currents injected change per unit length of the stripe-shaped active layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7A and 7B are sectional views, taken along lines perpendicular to the active layer of the laser shown in FIG. 5;

FIG. 8 is a sectional view showing, in detail, the active layer of the laser shown in FIG. 5;

FIG. 9 is a sectional view, taken along the stripes of the active layer of the semiconductor laser according to a second embodiment of this invention;

FIGS. 10A and 10B are sectional views, taken along lines perpendicular to the active layer of the laser shown in FIG. 9;

FIG. 21 is a plan view showing the general structure of a semiconductor laser according to a sixth embodiment of the present invention;

FIG. 22 is a sectional view, taken along a line perpendicular to the stripes of the active layer of the laser shown in FIG. 21;

DETAILED DESCRIPTION OF THE PREFERRED EMBODIMENTS

Figure 1:
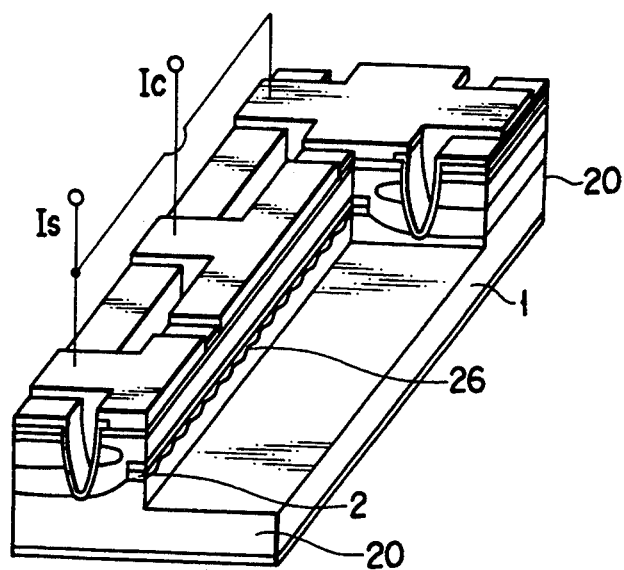
FIG. 1 is a perspective view showing a conventional three-electrode phase-shifted DFB laser.
Figure 2A:
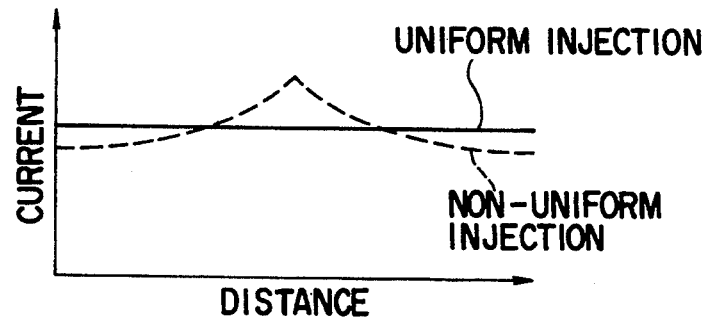
FIGS. 2A, 2B, and 2C are graphs explaining the operating principles of the three-electrode phase-shifted DFB laser shown in FIG. 1.
Figure 2B:
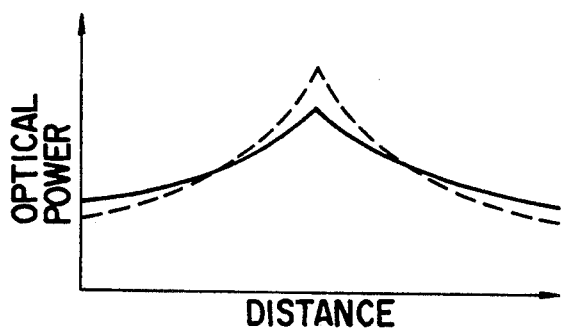
Figure 2C:
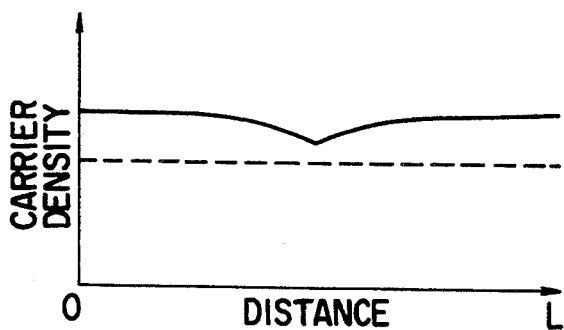
Figure 3:
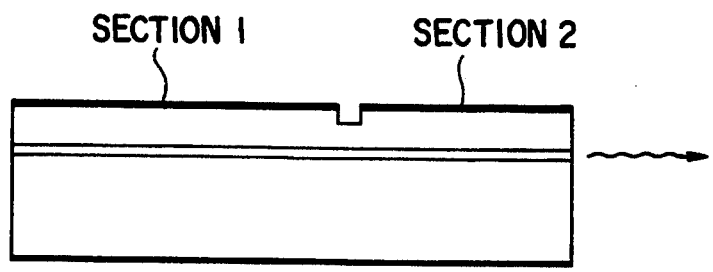
FIG. 3 is a diagram explaining the gain-lever effect attained in prior art.
Figure 4:
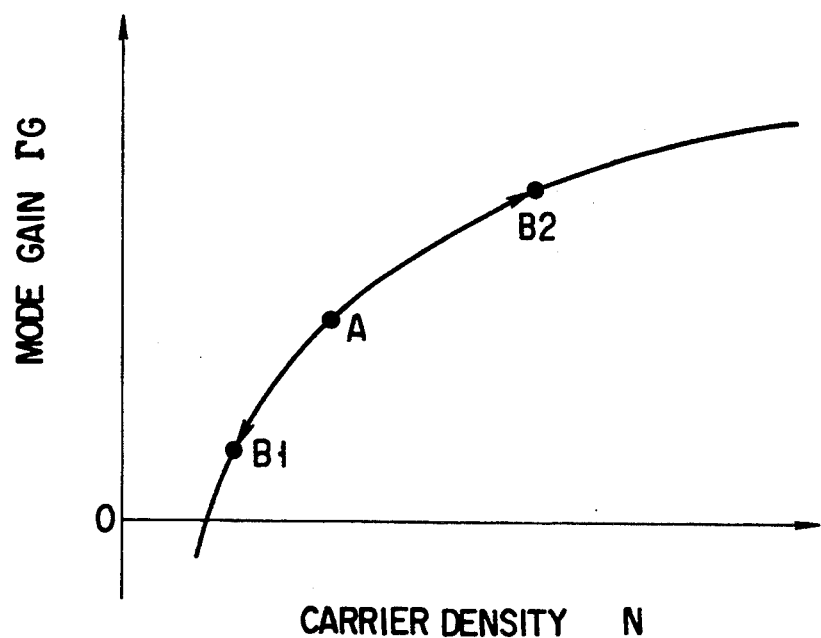
FIG. 4 is a graph, also explaining the gain-lever effect attained in prior art.

The present invention relates to a wavelength-tunable semiconductor laser of multi-electrode DFB structure, which has a distributed feedback resonator and first and second electrodes for independently controlling the current densities in the first and second sections in the resonator, respectively. The wavelength-tunable semiconductor laser is designed such that the temperature changes more greatly due to the change in the injected current density in the first section of the resonator than in the second section thereof.

Therefore, in order to change the oscillation wave length, the heat effect is enhanced over the carrier effect in the first section of the resonator, whereas the heat effect is suppressed with respect to the carrier effect in the second section of the resonator. The current in the first section and the current in the second section may be increased and decreased, respectively, thereby to change the oscillation wavelength at the same output power. When the current in the first section is increased, the heat effect and the carrier effect promote a red shift and a blue shift, respectively, but the red shift is predominant over the blue shift because the heat effect is enhanced. When the current in the second section is decreased, the heat effect and the carrier effect promote the blue shift and the red shift, respectively, but the red shift is predominant because the heat effect is suppressed. As a result, both sections contribute to the red shift, and the laser can be tuned over a broad wavelength range. Since both regions stay in oscillating state, a small spectral linewidth can be maintained despite oscillation wavelength can change greatly.

Various measures may be taken to change the temperature greater in the first section than in the second section due to change in the injected current density. Among these measures are:

1. To impart different heat transfer efficiencies to the first and second sections. For instance, the sections are so shaped that the first section loses less heat than the second section. More specifically, the first section is shaped, having a mesa cross-section taken along the line perpendicular to the axis of the resonator, whereas the second section is shaped, having a planar or mesa cross-section larger than the mesa cross-section of the first section. If this measure is taken, the first section has a higher heat resistance than the second section, and the temperature will rise more in the first section than in the second. Hence, as described above, both sections contribute to the red shift, whereby the laser can be tuned over a broad wavelength range, while maintaining a narrow spectral linewidth.

Alternatively, a first layer with small thermal conductivity may be formed between the active layer in the first section and a heat sink and the first layer may not be interposed between the active layer in the second section and the heat sink, thereby to achieve the same result. It may be desirable that the first section have a heat resistance 30% or more higher than that of the second section. If so, the temperature difference between the first section and the heat sink can be at least 30% greater than that between the second section and the heat sink. This leads to a significant difference between the first and second sections in terms of heat effect on the oscillation wavelength.

2. To impart different electric resistances to the first and second sections. For example, at least part of the current passage to the active layer in the first section is made electrically more resistant than the corresponding part of the current passages to the active layer in the second section. The term "current passage" used here includes a semiconductor cladding region, a contact region, a metal wiring, or the like. The method of rendering the current passage electrically resistant may be to change the dopant concentration, thickness, width, or composition of the semiconductor layer forming that current passage. An alternative method is to form a hetero-junction which blocks a flow of carriers. A thin electrode may be used in the first section, while using a broad electrode in the second section. If this measure is taken, more heat will be generated in the first section than in the second section when currents are injected to both sections. The power consumed due to the wiring or electrode resistance is converted into heat. (Roughly speaking, the resultant temperature change is proportional to the square of the change in current.) As a result, both sections serve to promote the red shift, and the laser can be tuned over a broad wavelength range, while maintaining a narrow spectral linewidth.

More specifically, it is desirable that the differential resistance of the first section be two or more times higher than that in the second section (5 Ω or less). If the first section has a differential resistance 5 Ω higher than that of the second section, and the current supplied to both sections is 200 mA, the power the first section consumes is 0.2 W greater than the power the second section consumes. Hence, a significant difference will be made between the first and second sections in terms of the amount of heat they generate.

3. To set different ineffective-current ratios to the first and second sections. For example, the first section is so formed as to have a larger ineffective current than the second section. More specifically, a larger leakage current is forced to flow in the buried layer contacting a side of the active layer in the first section than in the second section. Alternatively, the first and second sections may be formed such that the carrier density in the active layer changes with the current density, less in the first section than in the second section. Still alternatively, the lifetime of carriers in the active layer may be rendered shorter in the first section than in the second section, by means of, for instance, impurity doping.

Another method of setting different ineffective-current ratios to the first and second sections is to design the layer structure of the sections differently, thereby to make more electrons overflows the active layer in the first section than in the second section. More specifically, the barrier to the quantum well active layer is made less high or more thick in the first section, or the band gap of the cladding layer is rendered smaller in the first section, than in the second section, in order to cause more electrons to overflow the active layer.

If a greater ineffective-current ratio is imparted to the first section by forming a larger leakage current into the buried layer in the first section than in the second section, more heat will be generated in the first section than in the second section. Therefore, both sections contribute to the red shift, and the laser can be tuned over a broad wavelength range, while maintaining a narrow spectral linewidth.

More specifically, it is desirable that the ineffective current supplied to the first section, which is not used for stimulated emission, be several times larger than the current supplied to the second section. If the effective current and the ineffective current are 200 mA and 100 mA, respectively, and the voltage drop is 1.5 V, then the first section will generate more heat than the second section by an amount which corresponds to 0.15 W.

4. To impart a greater differential gain to carrier density to the first section than to the second section, though imparting a smaller differential gain, with respect to injected current density, to the first section than to the second section. This measure can be achieved by setting a greater differential gain, with respect to the carrier density, for the first section than for the second section, and by reducing the change in carrier density which is caused by the change in injected current, by means of the method specified in paragraph 3. The differential gain may be increased with respect to the carrier density in the first section by another method in which the gain-lever effect is enhanced by changing the operating points of the first and second sections or forming the active layers of the first and second section in different structures.

In the measures described in paragraphs 3 and 4, the current must be changed more in the first section than in the second section in order to obtain the same change in the carrier density in the active layer. The temperature therefore changes more in the first section than the second section, whereby both sections promote the red shift. Hence, the laser can be tuned over a broad wavelength range, while maintaining a narrow spectral linewidth.

The current density J and the carrier density N in the active layer, which govern the threshold oscillation wavelength, have the following relationship:

$$N/J = (1 - R_{of}) \times \tau_n / (e \cdot d) \quad (1)$$

where $R_{of}$ is ratio of an overflow current, $\tau_n$ is the lifetime of carriers in the active layer, e is an elementary electric charge, d is the thickness of the active layer. The value $\tau_n$ is reduced to change the carrier density in the active layer, or the value $R_{of}$ is increased to change the number of electrons overflowing the active layer (i.e., the ineffective-current ratio), thereby decreasing N/J for the first section.

When the semiconductor laser according to the present invention is operated in the gain-levering mode, the second section in which the wavelength changes much with changes in the carrier density functions as wavelength-controlling region. In the gain-levering mode, the differential gain is smaller with respect to the carrier density in the wavelength-controlling section than in the first region which function as gain region. Hence, the linewidth enhancement factor a in the second section is larger, enhancing the carrier effect. As indicated in paragraph 4, the differential gain with respect to the carrier density, Γ dG/dN, is smaller in the second section than in the first section, whereas the differential gain with respect to the current density, Γ dG/dJ, is smaller in the first section than in the second section. Γ is the light confinement coefficient, and G is the gain.

It follows that the first to the fourth measures can be combined. In the case, even if the numerical difference is smaller than that described above, it is possible to distinguish between the heat effect in the first section and that in the second section.

5. To form a temperature-controlling electrode on one side of each section. In a semiconductor laser having a plurality of split electrodes spaced apart along the stripes of the light-emitting section, each split electrode comprising at least two electrodes located in a plane perpendicular to the stripes. Currents are injected through these electrodes into the two portions of the light-emitting section such that the temperatures of these portions change differently when the currents injected into the light-emitting section change per unit length of the stripes.

Examples of this measure are as follows:

(a) The two electrodes are arranged such that the distance between the first electrode and the active layer differs from that between the second electrode and the active layer, in a plane which is perpendicular to the axis of the resonator.

(b) The two electrodes are formed such that the resistance between the first electrode and the active layer differs from the resistance between the second electrode and the active layer.

(c) Heating means is used to heat the portion along the resonator instead of forming two electrodes.

Apart from the measures described above, the following measures can be taken in the present invention.

(1) To locate the second section on the front face of the laser (i.e., the light-emitting side), and to impart a low reflectivity and a high reflectivity to the front and rear facets, respectively. In the two-electrode DFB laser whose front and rear facets having different reflectivities, the electric field of the light in the resonator concentrates on the rear facet, and the refractive index at the rear section contributes much to wavelength changes. The light output greatly depends on the current injected into the section located at the light-emitting face. To achieve red shift by virtue of heat effect, while not changing the light output, it is necessary to reduce a little the current in the light-emitting section and to greatly increase the current in the rear section. The heat effect is thereby enhanced in the rear section, making it possible to change the oscillation wavelength even more.

(2) To form the phase-shifted region of a diffraction grating in the center section of a multi-electrode DFB laser whose resonator consists of at least three sections, or the center section and two end sections. Preferably, a low-reflectivity coating be formed on each facet of the laser. It is desirable that KL be 2 or more, where K is the coupling coefficient of the diffraction grating and L is the length of the resonator. The heat effect in the center section is enhanced, whereby the oscillation wavelength can be changed much more.

(3) To use a strained quantum well layer for at least one part of the active layer. Use of a strained quantum well layer having a high differential gain for the active layer will improve the characteristic of the active layer or compensate for the characteristic deterioration thereof. Also, the strained quantum well layer increases freedom for differential gain and threshold carrier density. In other words, the active layer can be modified in its structure, thereby to enhance the gain-lever effect very much.

(4) To apply negative feedback of current via, for example, the first section in order to achieve automatic frequency control (AFC). In the present invention, the first section more contribute to wavelength changes than the second section because the heat effect is much more enhanced in the first section than in the second section. For effecting AFC, it would be better to apply current feedback or frequency modulation to the first section than to the second section. This measure, if taken, will accomplish reliable AFC.

(5) To use a terminal resistor, a power-supplying line, or the like to supply high-speed signals to at least one section, e.g., the first section, thereby to perform frequency modulation. This method helps effect high-speed, high-efficiency frequency modulation. Thermal response should be fast to ensure high-speed frequency modulation. In the present invention, the thermal response is as fast as sub-nanoseconds since the heat source is located near the active layer.

Embodiments of the present invention will now be described, with reference to the accompanying drawings.

Figure 5:
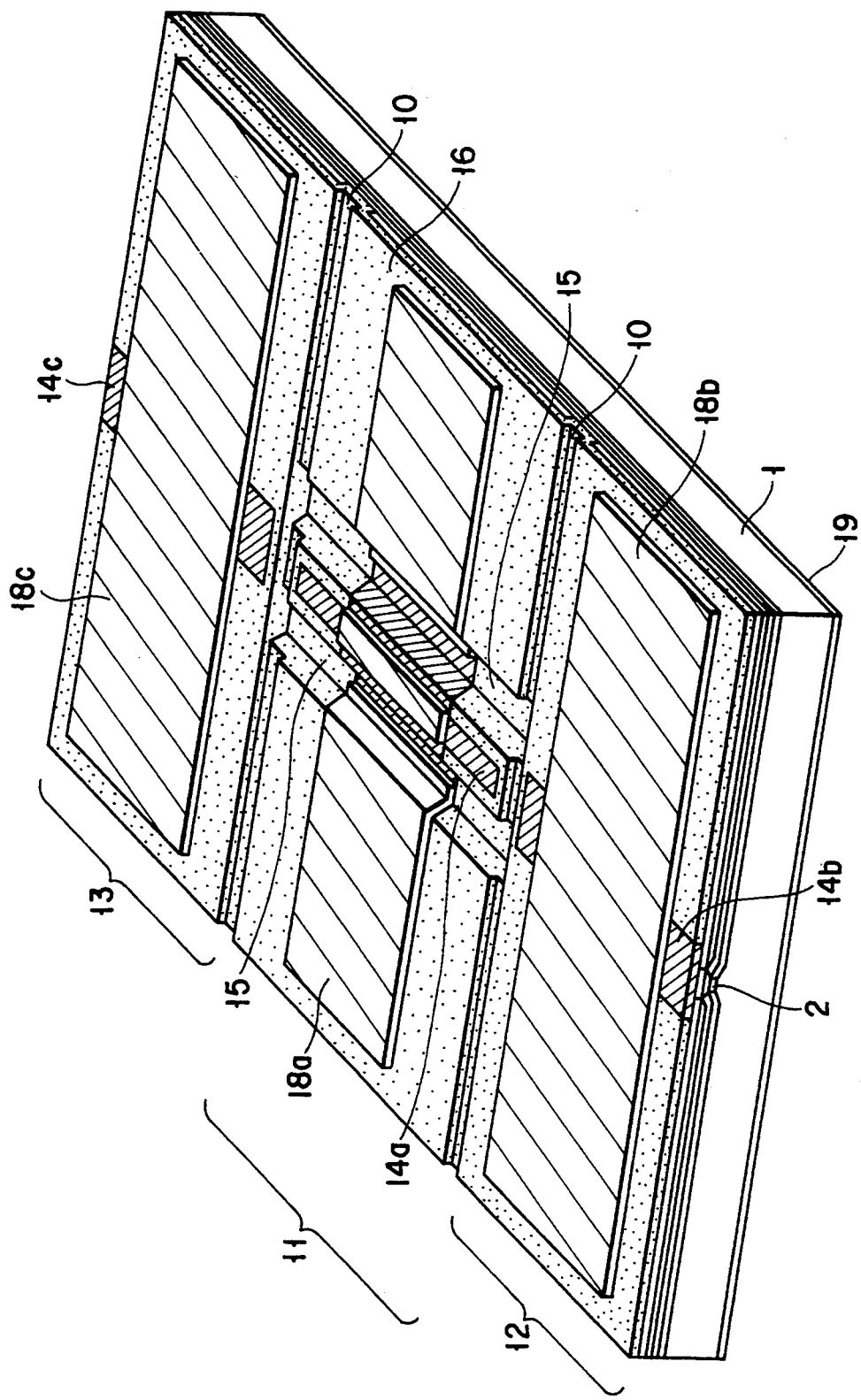
FIG. 5 is a perspective view showing a three-electrode phase-shifted DFB wavelength-tunable laser according to a first embodiment of the invention.
Figure 6:
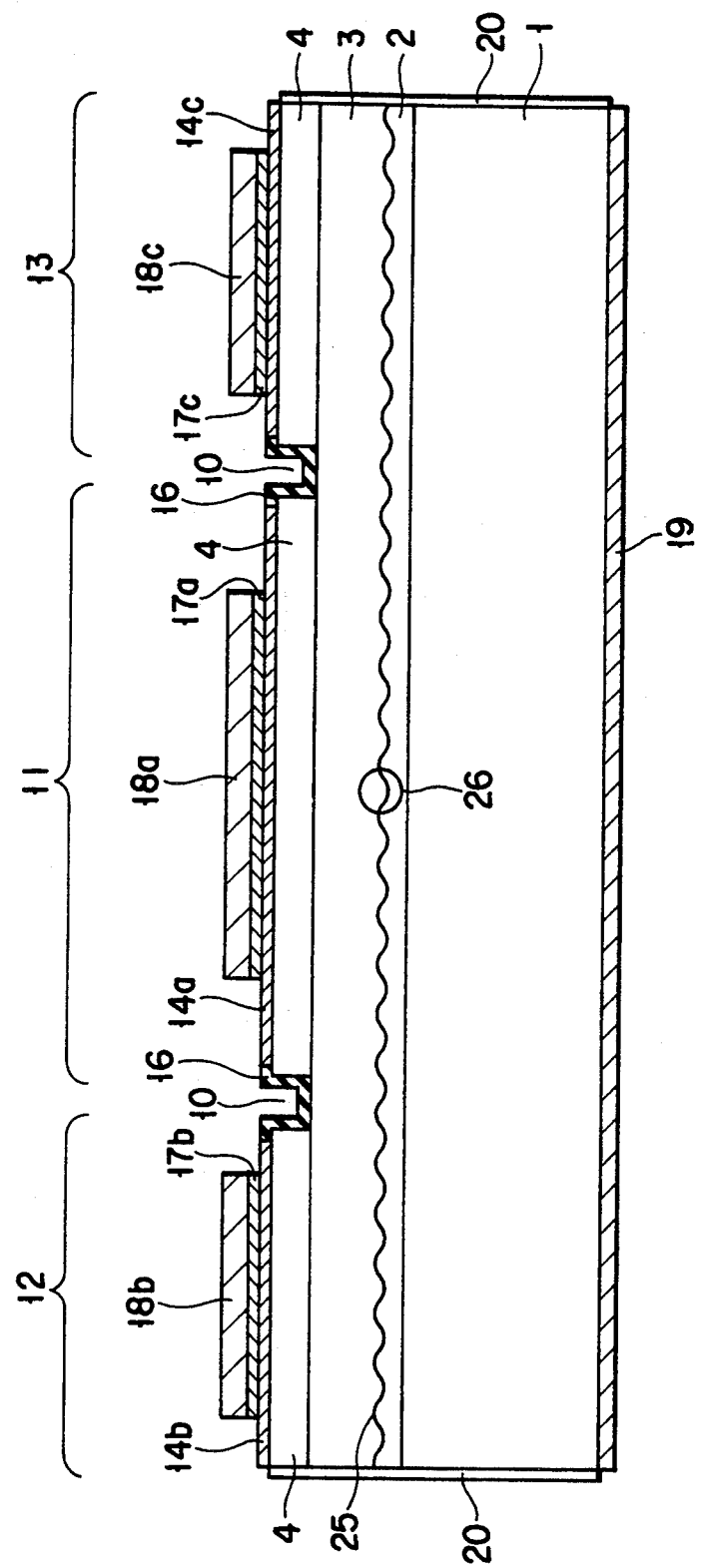
FIG. 6 is a sectional view, taken along the active layer of the laser shown in FIG. 5.

FIGS. 5 to 8 show a three-electrode DFB wavelength-tunable semiconductor laser which is a first embodiment of the present invention. FIG. 5 is a perspective view of the semiconductor laser. FIG. 6 is a sectional view, taken along the stripe of the active layer of the laser. FIG. 7A is a sectional view of the center section (i.e., the first section) of the laser, taken along a line perpendicular to the stripe of the active layer. FIG. 7B is a sectional view of one of the end sections (i.e., the second section) of the laser, taken along a line perpendicular to the stripe of the active layer. FIG. 8 is a sectional view showing, in detail, the active layer of the semiconductor laser.

The laser comprises an n-type InP substrate 1, an active layer 2 (including a waveguide layer) formed the substrate 1, a p-type InP cladding layer 3 formed on the active layer 2, p-type InGaAs ohmic-contact layers 4 constituting mesa stripes and formed on the cladding layer 3, a p-type Inp layer 6 burying the mesa stripes, an n-type InP layer 7, a p-type InGaAsP layer 8, and an undoped InGaAsP layer 9. These active layers have been formed by organic metal chemical vapor deposition.

As shown in FIG. 8 in detail, the active layer 2 comprises a strained quantum well structure, a lower light-guiding layer 23 formed on the lower surface of the strained quantum well structure, and an upper light-guiding layer 24 formed on the upper surface of the strained quantum well structure. The well structure consists of strained well layers 21 and barrier layers 22 which are alternately laid on upon another. The layers 21 is made of $In_{0.7}Ga_{0.3}As$, having a thickness of 3 nm. The lower light-guiding layer 23 is made of InGaAsP and has a thickness of 30 nm. The upper light-guiding layer 24 is made of InGaAsP and has a thickness of 100 nm. A diffraction grating 25 is formed in the layer 24. The barrier layer 22 has a thickness of 10 nm, is lattice-matched with Inp, and is made of InGaAsP having a composition corresponding to wavelength of 1.3 μm. The diffraction grating 25 is buried in the p-type InP layer. The diffraction grating 25 has a phase shift region 26 located at the midpoint in the resonator of the laser.

As best shown in FIGS. 5 and 6, the grooves 10 define three sections of the semiconductor laser, i.e., a center section 11 and end sections 12 and 13. P-type ohmic electrodes 14a, 14b, and 14c made of Au/Zn/Au are formed on the ohmic contact layers 4, respectively, except for those portions near the grooves 10. The electrode 14a located at the center section 11 has a width of 4 μm. The electrodes 14b and 14c located at the end sections 12 and 13, respectively, have a width of 20 μm. Due to the different widths of the ohmic electrodes 14a, 14b and 14c, the center section 11 has a contact resistance of 10 Ω, whereas the end portions 12 and 13 have a contact resistance of 5 Ω.

As can be understood from FIGS. 5 and 7A, the center section 11 has parallel mesa grooves 15 in its upper surface. These grooves 15 define, between them, a mesa stripe having a width of 7 μm. Each mesa groove 15 has been formed by removing those parts of InGaAsP layers 8 and 9.

An insulating film 16 is formed on those portions of the ohmic-contact layers 4 which are not covered by the p-type ohmic electrodes 14a, 14b, and 14c. Wires 17a, 17b, and 17c, each made of Cr/Au, are formed on the ohmic-contact layers 4 and the insulating film 16. Bonding pads 18a, 18b, and 18c made of Ti/Pt/Au, each acting as a wire as well, are formed on the wires 17a, 17b, and 17c, respectively. The Ti/Pt/Au wire 18a is partially removed on the side surface of the groove 15 on the stripe side. The residual Cr/Au layer 17a functions as a resistive film having a series resistance of about 10 Ω. The n-type ohmic electrode 19 is formed on the lower surface of the InP substrate 1.

The semiconductor laser chip is about 1 mm long, about 300 μm wide, and about 80 μm thick. The center section 11 is about 400 μm long, whereas the end portions 12 and 13 are about 300 μm long. The facets of the chip have been formed by cleaving. They are coated with a film 20 having a reflectivity of as low as 1% or less. The diffraction grating 25 has a coupling coefficient K of 30 cm$^{-1}$.

The laser chip is mounted on a heat sink, by using AuSn solder. The heat sink, which functions ground electrode, is maintained at a predetermined temperature by means of a temperature sensor and a Peltier element. Each electrode pad 18 is connected, by bonding, to a power-supplying line formed on a ceramic substrate. The currents to inject into the sections 11, 12, and 13 can be controlled independently. The laser chip, the heat sink, the temperature sensor, the ceramic substrate incorporated in a laser module, along with a lens system which are used to connect the laser chip to an output optical fiber, an optical isolator, an output monitor photodiode, and the like.

As will be described, automatic power control (APC) is performed on the ohmic electrode 14b at the light-emitting face since the light output greatly depends on the current injected into the section 12 located near the light-emitting facet, and automatic frequency control (AFC) is effected on the ohmic electrode 14a of the center section 11 since the center section 11 more contribute to wavelength changes than the end sections 12 and 13. To perform high-speed FSK modulation on the semiconductor laser, a modulation current is supplied to the ohmic electrode 14a through an impedance matching resistor. In this case, at least part of a resistor having a resistance higher than that of the second section may be used as a part of this impedance matching resistor.

The wavelength-tunable laser shown in FIG. 5 operates, basically on the same principles as the conventional laser shown in FIG. 1. The semiconductor laser of FIG. 5 can achieve a more prominent red shift because the temperature rise greatly due to the increased current supplied to the center section 11. Stated more precisely, the series resistance of the electrode 14a, the wire 17a, and the electrode pad 18a is about 18 Ω higher than the series; resistance of the end sections 12 and 13. The heat generated because of the high series resistance is transferred into the heat sink through a passage near the active layer 2. The temperature of the active layer 2 rises far more than in the conventional wavelength-tunable laser shown in FIG. 1. This is why a great red shift is attained in the semiconductor laser of FIG. 5.

Needless to say, the hole burning effect as well contributes to the red shift as in the conventional wavelength-tunable laser shown in FIG. 1. The required temperature change is therefore smaller than in a temperature-control type wavelength-tunable laser, and the reliability is higher than that of a temperature-control type wavelength-tunable laser. Since hole burning is suppressed, the total carrier density decreases despite the increase in the carrier density of the center section, the carrier effect contributes to the red shift, rather than the blue shift.

In order to change the wavelength, while maintaining the constant output power, it is necessary to reduce the currents into the end sections 12 and 13 by the increase in the current injected into the center section 11. The red shift resulting from the decrease in the carrier densities of the section 12 and 13 serves to suppress the hole burning. The blue shift, resulting from the heat effect in the sections 12 and 13, may be problematical. The influence of the blue shift is, however, suppressed in this invention for the following reason.

Since the end section 12 is located near the light-emitting face, the current injected into the section 12 influences the output light more greatly than the current injected into the center section 11. Thus, the currents into the end sections 12 and 13 need not be reduced so much as the current into the center section 11 is increased, if the output power is to be maintained unchanged. In the present embodiment, the heat transmitted from the center section 11 raises the temperatures of both end sections 12 and 13 considerably, inevitably reducing the output light. To compensate for this output light reduction, somewhat large currents are into the sections 12 and 13. Hence, the current reduction of the sections 12 and 13, if necessary, is very small. Since the reduction in the currents into the end section 12 and 13 is small, and the heat is transmitted from the center section 11 to the sections 12 and 13, virtually no temperature fall takes place in the end sections 12 and 13. This is why the blue shift caused by the heat effect is suppressed.

Therefore, the laser described above can be tuned over a broad wavelength range while oscillating in the DFB single mode—that is, while maintaining the output light at a constant value. In addition, since the active layer 2 of the laser has a strained quantum well structure having a high differential gain, it is advantageous over the conventional wavelength-tunable laser in terms of threshold oscillation wavelength, maximum output, oscillation spectral linewidth, and the like.

In the three-electrode DFB wavelength-tunable semiconductor laser of the first embodiment having both facets having a low-reflectivity coating, the electrode of the center section which has an intense electric field more influences the wavelength of the output light than the electrodes of the end sections, and the electrodes of the end sections which are close to the light-emitting face more influence the magnitude of the output light than the electrode of the center section. In the present invention, the center section which influences the wavelength of the output light contributes mainly to the heat effect and is therefore used as first section. Nonetheless, even if the center section is used as second section, the same advantage as the first embodiment (FIG. 5) attains will be accomplished. Also, the same advantage will be achieved if the laser is modified to have a phase-controlling section, an asymmetrical structure, sections differing in the structures of the active layer and diffraction grating, several phase-shifting regions dispersed, a window formed on either face and having no active layer, and a light-emitting face inclined, not perpendicular, to the stripe of the active layer.

Figure 11A:
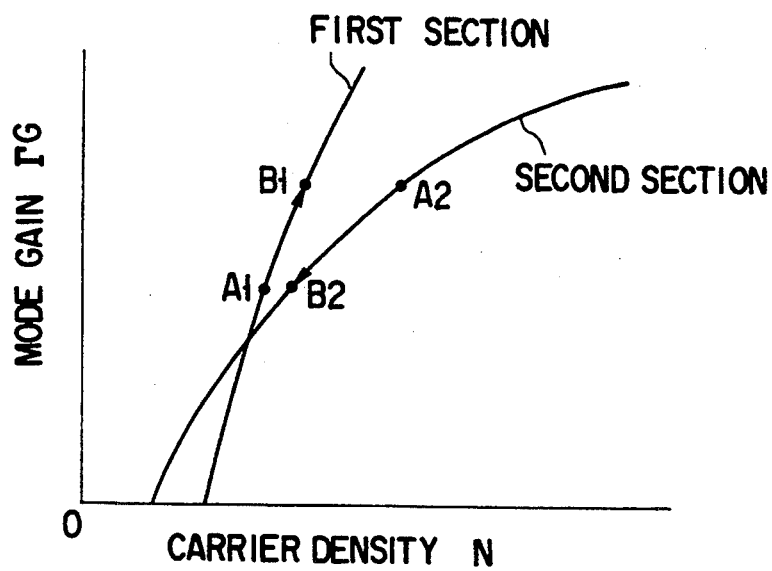
FIGS. 11A and 11B are graphs representing the relationship between differential gain and carrier density and the relationship between the differential gain and current density, respectively, both observed in the semiconductor laser shown in FIG. 9.
Figure 11B:
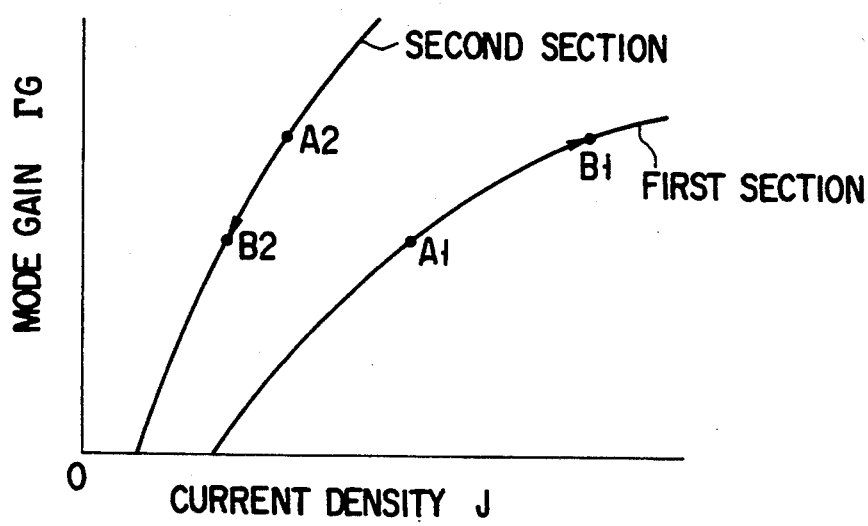

A DFB wavelength-tunable semiconductor laser which is a second embodiment of the present invention will be described, with reference to FIG. 9, FIGS. 10A and 10B, and FIGS. 11A and 11B. FIG. 9 is a sectional view, taken along the stripe of the active layer of the laser. FIG. 10A is a sectional view, taken along a line perpendicular to the active layer of the first section 111 of the laser shown in FIG. 9. FIG. 10B is a sectional view, taken along a line perpendicular to the active layer of the second section 112 of the laser shown in FIG. 9. FIGS. 11A and 11B are graphs representing the relationship between differential gain and carrier density and the relationship between the differential gain and current density, respectively, both observed in the laser shown in FIG. 9.

This is a two-electrode DFB wavelength-tunable laser which has self-aligned constricted mesa (SACM) structure. The laser comprises an n-type InP substrate 1, an quantum well active layer 2 formed on the substrate 1, a p-type InP cladding layer 3 formed on the active layer 2, and two p-type InGaAs ohmic-contact layers 4 formed on the cladding layer 3. The active layer 2, the cladding layer 3, and the ohmic-contact layers 4 have been formed by organic metal chemical vapor deposition. The laser further comprises a diffraction grating 25 formed on the active layer 2, and a zinc-diffused layer 102 formed in that portion of the active layer 2 which is included in the first section 111. The ohmic-contact layers 4, are spaced apart from one another, defining a groove 10 among them. The two ohmic-contact layers 4 are components of the sections 111 and 112, respectively. That portion of the cladding layer 3 on which no ohmic-contact layer is formed, is covered with an SiO₂ film 16.

As shown in FIGS. 10A and 10B, both sections 111 and 112 are shaped like a narrow mesa. The section 111 has an ohmic electrode 14a and an air-bridge wire 18a connected to a bonding pad (not shown). Similarly, the second section 112 has an ohmic electrode 14b and an air-bridge wire 18b connected to another bonding pad (not shown). A common n-type ohmic electrode 19 is formed on the lower surface of the substrate 1. The first section 111 is about 600 μm long, and the second section 112 is about 300 μm long. That facet of the laser which is one end of the first section 111 is coated with a high-reflectivity coating 120, and the opposite facet of the laser, which is one end of the second section 112, is coated with a low-reflectivity coating 20. Though not shown, the laser chip will be into a laser module, along with optical components, power-supply lines, and a temperature controlling devices.

Since the active layer of the first section 111 is doped with zinc which is a p-type dopant, the first section 111 has a greater differential gain than the second section 112 with respect to the carrier density. However, the lifetime $\tau_n$ of carriers in the first section 111 is only 0.3 ns, whereas the lifetime $\tau_n$ of carriers in the second section 112 is 2 ns, inevitably because of the zinc doped in the first section 111. As can be understood from the equation (1) set forth above, the current density must be changed several times greater in the first section 111 than in the second layer 112, in order to change the carrier density in the first section 111 as much as in the second section 112.

Further, since the zinc is doped also in the buried homogeneous junctions formed in both sides of the active layer 2, the carrier recombination lifetime is shorter in these junctions than in any other part of the active layer 2. The ratio of leakage current is therefore higher in the first section 111 than in the second section 112. As evident from FIG. 11B, the differential gain in the first section 111 is smaller with respect to the current density than in the second section 112. As a result, the ineffective current flowing in the first section 111 is larger than the ineffective current flowing in the second section 112. In other words, the greater part of the current consumed in the first section 111 converts into heat.

The operation of the semiconductor laser, which is the second embodiment of the present invention, will now be explained, with reference to FIGS. 11A and 11B. At first, the operating points of the sections 111 and 112 are at points A1 and A2 as illustrated in FIG. 11A. Then, the current in the first section 111 is increased to point B1, whereas the current in the second section 112 is decreased to point B2. The oscillation wavelength of the laser is thereby changed, while scarcely changing the power of the light emitted from the end of the second section 112. In the first section 111, the increase in carrier density is small, and the increase in current density is large; the red shift due to the heat effect is therefore much greater than the blue shift due to the carrier effect. In the second section 112, the decrease in current density is small, and the temperature fall, if any, is small; the blue shift due to the heat effect is negligible. However, the red shift in the second section 112 due to the carrier effect is prominent since the differential gain is small with respect to the carrier density, and hence the linewidth enhancement factor $\alpha$ is large.

As a result, the laser can achieve a greater red shift than the conventional multi-electrode DFB laser. While performing the red shift, the laser according to the second embodiment of the invention keeps operating in single DFB mode. Even if the spectral linewidth is slightly increased by the carrier fluctuation due to leak current, the laser can therefore maintain a narrower linewidth than a DBR laser which has a passive waveguiding layer. Because of the effective use of both the heat effect and the carrier effect, the laser can output more power with higher reliability than a laser of the type in which only the heat effect serves wavelength tuning.

In the second embodiment, the electrode located near the facet with the high-reflectivity coating more influences the wavelength of the output light than the electrode formed near the light-emitting facet with the low-reflectivity coating 20, and the electrode formed near the light-emitting face more influence the magnitude of the output light than the electrode located near the facet with the high-reflectivity coating. Hence, APC feedback is applied to the electrode 14b, and AFC feedback to the electrode 14a. The same advantage will be achieved if the laser of the second embodiment is modified in such various ways as is the first embodiment as indicated above.

Figure 12:
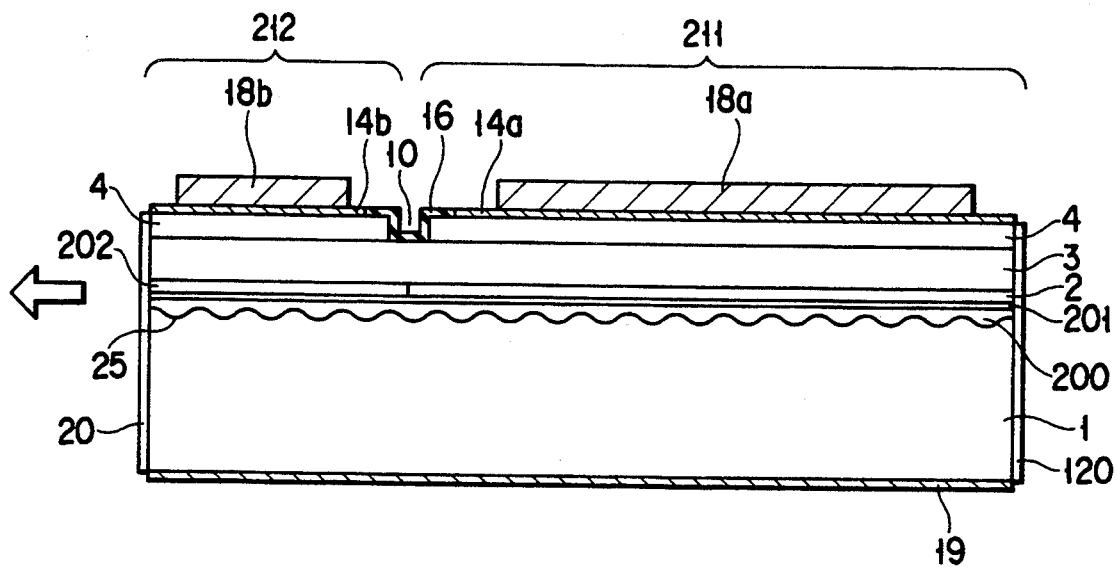
FIG. 12 is a sectional view of a semiconductor laser according to a third embodiment of the invention, taken along the length of the resonator of the laser.
Figure 13A:
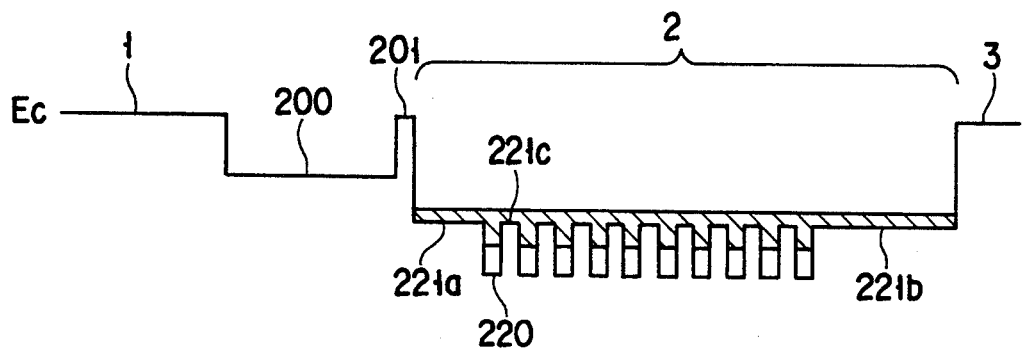
FIGS. 13A and 13B are schematic representation of the band structure formed near the active layer of the semiconductor laser shown in FIG. 12.
Figure 13B:
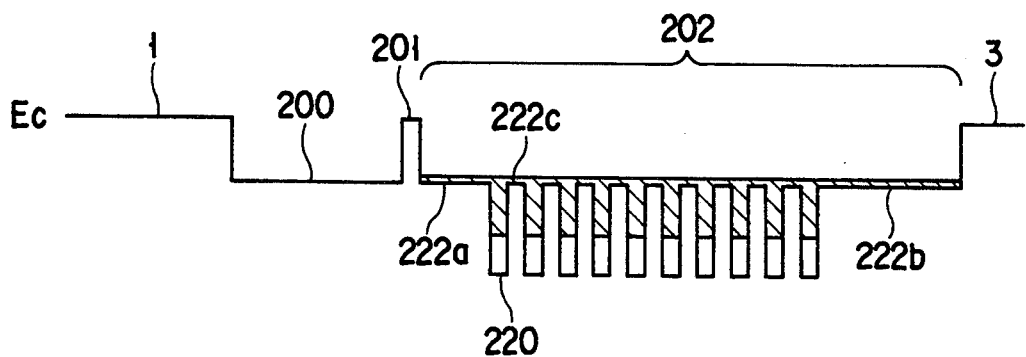

A semiconductor laser which is a third embodiment of the present invention will be described, with reference to FIG. 12 and FIGS. 13A and 13B. FIG. 12 is a sectional view of a semiconductor laser according to a third embodiment of the invention, taken along the length of the resonator of the laser. FIGS. 13A and 13B are schematic representation of the band structure formed near the active layer of the laser.

This is a two-electrode DFB wavelength-tunable laser which has self-aligned constricted mesa (SACM) structure. The laser comprises an n-type InP substrate 1, a waveguide layer 200 formed on the substrate 1, an undoped InP etching stopper layer 201 formed on the layer 200, a quantum well active layer 2 formed on the layer 201, another quantum well active layer 202 formed on the layer 201, an InP cladding layer 3 formed on the active layers 2 and 202, and two p-type InGaAsP ohmic-contact layers 4 formed on the cladding layer 3. The light-guiding layer 200, the etching stopper layer 201, the active layers 2 and 202, the cladding layer 3, and ohmic-contact layers 4 have been formed by organic metal chemical vapor deposition. The waveguide layer 200 is made of undoped InGaAsP of a composition which has band gap of 1.1 $\mu$m. The etching stopper layer 201 has a thickness of 10 nm. The cladding layer 3 is formed of a p-type InP.

The laser further comprises a diffraction grating 25 formed at the interface between the substrate 1 and the waveguide layer 200. The waveguide layer 200 has a thickness of 100 nm and has a substantially flat upper surface. As shown in FIG. 13A, the quantum well active layer 2 of the first section 211 has a barrier layer 221 made of InGaAsP of a composition which has band gap of 1.3 $\mu$m. As illustrated in FIG. 13B, the quantum well active layer 202 of the second section 212 has a barrier layer 222 made of InGaAsP of a composition which has band gap of 1.1 $\mu$m. Either quantum well layer 220 is made of $In_{0.53}Ga_{0.47}As$, is 8 nm thick, and has ten quantum wells. Barrier layers 221a and 222a, both sandwiched between the etching stopper layer 201 and the lowermost well layer, have a thickness of 30 nm. Barrier layers 221b and 222b, both sandwiched between the uppermost well layer and the p-type cladding layer 3 have a thickness of 70 nm. Barrier layers 221c and 222c, both sandwiched between the well layers 220 have a thickness of 12 nm.

The laser having the structure specified above can be manufactured by forming the waveguide layer 200, the etching stopper layer 201, and the active layers 2 or 202, then removing unnecessary portions of the active layer 2 or 202 and also the unnecessary portions of the etching stopper layer 201, and finally growing the remaining portions of the active layer 202 or 2. In addition, different carrier lifetimes may be imparted to the active layers 2 and 202, by doping or controlling growing conditions.

The two ohmic-contact layers 4, are spaced apart from one another, defining a groove 10 among them. P-type ohmic electrodes 14a and 14b are formed on the ohmic-contact layers 4, respectively. That upper-surface portion of the mesa structure on which no ohmic-contact layer is formed, is covered with an $SiO_2$ film 16.

Wires 18a and 18b are connected at one end to the ohmic electrodes 14a and 14b, respectively, and at the other end, to bonding pads (not shown). A common n-type ohmic electrode 19 is formed on the lower surface of the substrate 1. The first section 211 is about 400 $\mu$m long, and the second section 212 is about 200 $\mu$m long. That facet of the laser which is one end of the first section 211 is coated with a high-reflectivity coating 120, and the opposite facet of the laser, which is one end of the second section 212, is coated with a low-reflectivity coating 20.

Though not shown, the laser chip is incorporated in a laser module, as in the second embodiment, along with optical components, power-supply lines, and a temperature controlling devices. APC feedback is applied to the electrode 14b, and AFC feedback to the electrode 14a.

It will be explained how the semiconductor laser, which is the third embodiment of the invention, red-shifts the wavelength when the currents in the sections 211 and 212 are increased and decreased, respectively, while maintaining the power output from the light-emitting face with the low-reflectivity coating 20 at substantially a constant value.

The conduction band between the well layer 220 and barrier layer 221 of the active layer 2 has a band discontinuity $\Delta Ec$ of about 61 meV. The quantum level in the well layer 220 is at 35 meV higher than the band edge. Thus, each well of the first section 211 has a quantum-level depth of about 26 meV only. Half or more of all electrons supplied overflow the two-dimensional electron density of the well at a high current-injection level.

On the other hand, the conduction band between the well layer 220 and barrier layer 222 of the active layer 202 has a band discontinuity $\Delta Ec$ of about 113 meV. The quantum level in the well layer 220 is at 45 meV distance from the band edge. Each well formed in the second section 212 has a quantum-level depth of about 68 meV. The ratio of the electrons overflowing the two-dimensional electron density of the well is low at a high current-injection level.

The first section 211 in which each quantum well is shallow in terms of quantum level has a longer gain-peak wavelength than the second section 212 in which each quantum well is deep in terms of quantum level. Hence, the oscillation wavelength is set at a shorter wavelength with respect to the gain-peak wavelength in the first section 211 than it is set in the second section 212. The differential gain with respect to the carrier density tends to be greater in shorter wavelength with respect to the gain peal. It is therefore possible to set a greater differential gain for the first section 211 than for the second section 212, with respect to the carrier density. Alternatively, a greater differential gain with respect to the current density may be set for the second section 212 since the ineffective-current ratio is lower in the second section 212 than in the first section 211. Further, as in the second embodiment, it is possible to increase still more the differential gain with respect to the carrier density to decrease even more the differential gain with respect to the current density, by doping the active layer in the first section 2. As a result, the differential gain has such relationship with the carrier density and with the current density as is represented in FIGS. 11A and 11B.

The ineffective current due to the recombination of the overflowing electrons is therefore larger in the first section 211 than in the second section 212. The change in gain, caused by the current injected, is less in the first section 211 than in the second section 212, and the temperature rises more in the first section 211 than in the second section 212. Hence, the heat effect thus attained in the first section 211 enhances the red shift as in the second embodiment. The temperature falls, if any, in the second section 212 is so small that the red shift due to the carrier reduction is predominant. Stated in another way, the laser according to the third embodiment of the invention achieves a prominent red shift.

With the third embodiment it is not absolutely necessary for the two sections 211 and 212 to be opposite in respect of gain-carrier density relation and gain-current density relation, as is illustrated in FIGS. 11A and 11B. The advantage described above may be produced by unbalancing the sections 211 and 212 in terms of the heat-effect contribution and the carrier-effect contribution. It is effective particularly when the gain-carrier density relation of FIG. 11A and the gain-current density relation of FIG. 11B hold in the first section 211 and the second section 212. Needless to say, the third embodiment can be modified in such various ways as the first embodiment is modified as described above.

Figure 14:
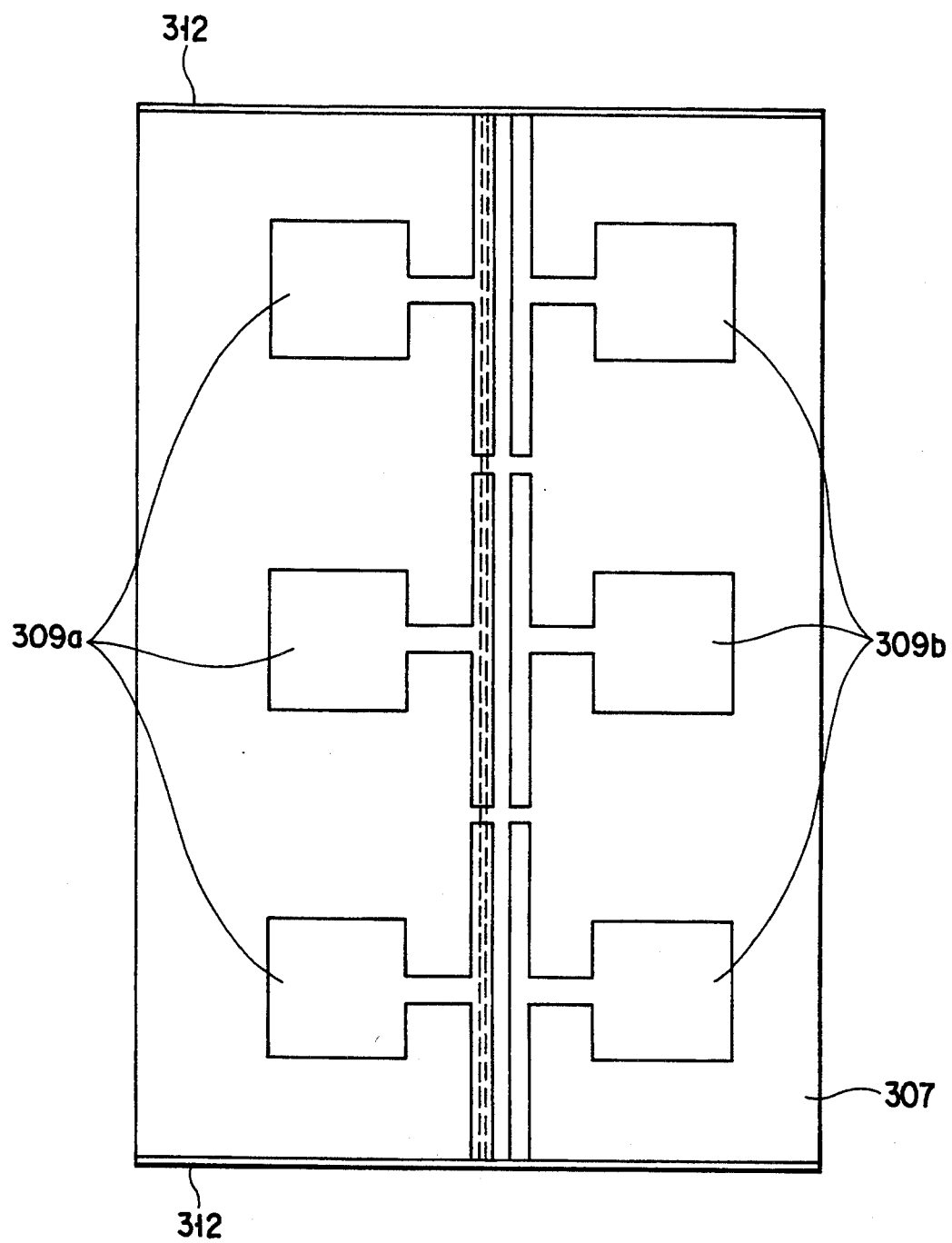
FIG. 14 is a plan view showing the general structure of a semiconductor laser according to a fourth embodiment of the present invention.
Figure 15:
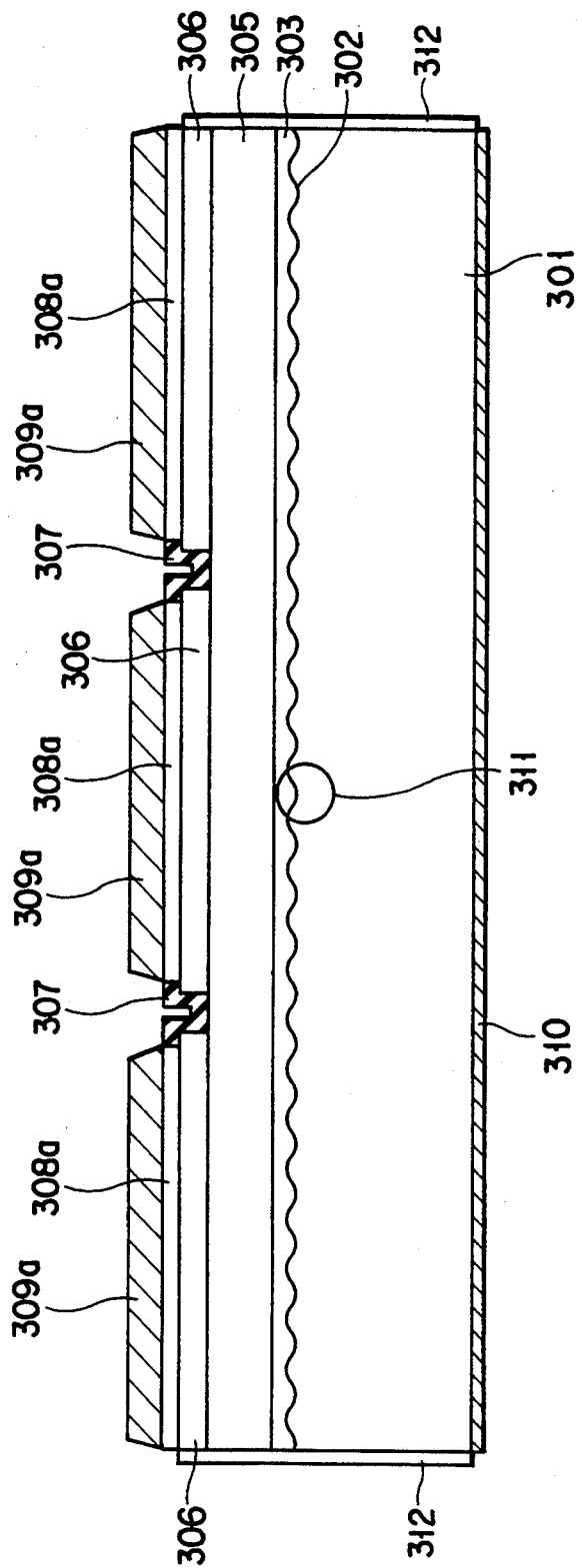
FIG. 15 is a sectional view, taken along the stripes of the active layer of the semiconductor laser shown in FIG. 14.
Figure 16:
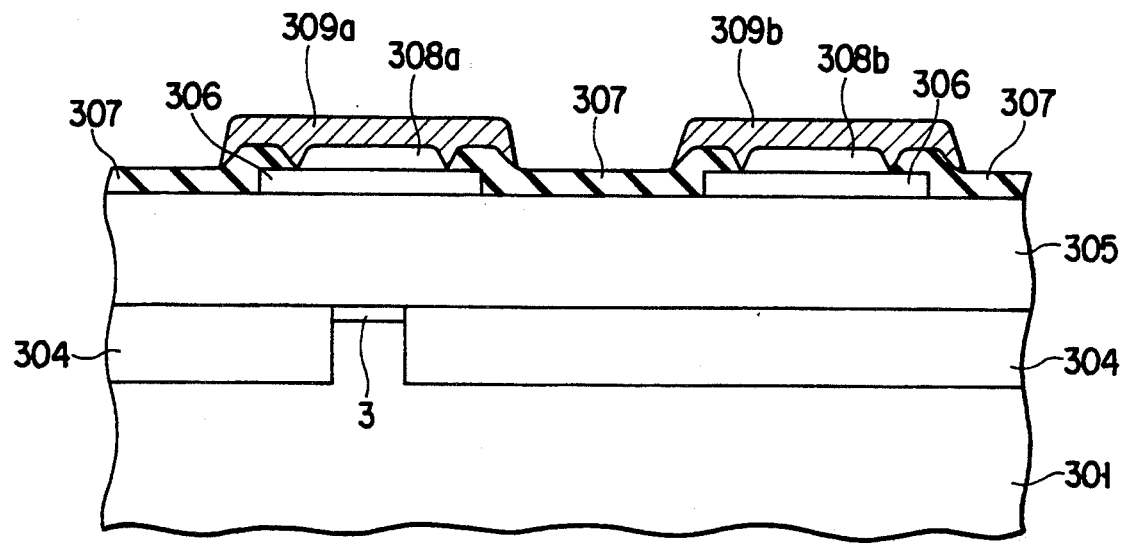
FIG. 16 is a sectional view, taken along a line perpendicular to the stripes of the active layer of the laser shown in FIG. 14.

A multi-electrode DFB semiconductor laser which is a fourth embodiment of the invention will be described, with reference to FIGS. 14, 15, and 16. FIG. 14 is a plan view showing the general structure of this laser. FIG. 15 is a sectional view, taken along the stripe of the active layer of the laser. FIG. 16 is a sectional view, taken along a line perpendicular to the stripe of the active layer.

The laser comprises an n-type InP substrate 301, a diffraction grating 302 formed on the substrate 301, an active layer 303 (including waveguide layer) formed on the grating 302, a semi-insulating p-type InP layer 304 formed, embedding the sides of the mesa-shaped active layer 303, a p-type InP cladding layer 305 formed on the active layer 303 and the semi-insulating layer 304, and a p-type InGaAs contact layer 306 formed on the cladding layer 305. The layers 303, 304, 305, and 306 have been formed by organic metal chemical vapor deposition. The contact layer 306 is divided into a plurality of parts every electrodes by $SiO_2$ layer 307. Two contact layers 306 are formed along the stripe of the active layer 303, that is, along the length of the resonator of the laser.

The multi-electrode DFB semiconductor laser is comprised of three sections, arranged along the length of the resonator. Each section is 300 $\mu$m long. The laser further comprises a phase-shifting region 311 formed in the center portion of the diffraction grating 302. The phase-shifting region 311 corresponds to a quarter wavelength. Both facets of the laser, formed by cleaving, are coated with a $SiN_x$ film 312 having a reflectivity as low as 1% or less. In FIG. 14, the broken lines indicate where the stripe of the active layer 303 is located.

Figure 17:
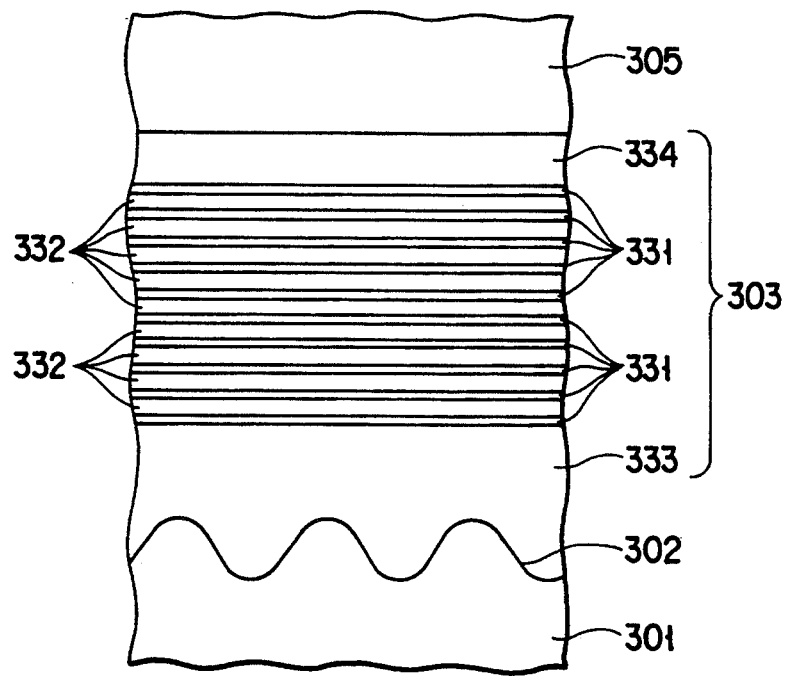
FIG. 17 is a sectional view showing, in detail, the active layer of the laser shown in FIG. 14.

As is shown in detail in FIG. 17, the active layer 303 is formed of a quantum well structure, a lower InGaAsP light-guiding layer 333 formed on the lower surface of the quantum well structure, and an upper InGaAsP light-guiding layer 334 formed on the upper surface of the quantum well structure. The quantum well structure consists of InGaAs well layers 331 and InGaAsP barrier layers 332, which are alternately laid on upon another. The well layers 331 have a thickness of 6 nm, and the barrier layers 332 a thickness of 10 nm. The lower light-guiding layer 333 has a thickness of 70 nm, and the upper light-guiding layer 334 has a thickness of 30 nm.

In the fourth embodiment, split p-type ohmic electrodes 308 made of Au/Zn/Au are formed on the divided regions, respectively. Each ohmic electrode 308 comprises first and second electrodes 308a and 308b formed in parallel to the direction of the resonator. Wiring/bonding pads 309a made of Cr/Au are formed to be in contact with the electrode 308a, respectively, and wiring/bonding pads 309b made of Cr/Au are formed to be in contact with the electrodes 308b, respectively.

The first electrodes 308a are located right above the active layer 302, and the second electrodes 308b are spaced apart from the first electrodes 308a. The electrodes 308a and 308b are arranged in a plane perpendicular to the length of the resonator, as is obvious from FIG. 16 which is a sectional view taken along a line perpendicular to the stripes of the layer 302. An n-type ohmic contact electrode 310 is formed on the lower surface of the substrate 301.

The laser chip is mounted on a heat sink (i.e., the ground electrode), by using AuSn solder. The heat sink, which functions ground electrode, is maintained at a predetermined temperature by means of a temperature sensor and a Peltier element. The bonding pads 309a and 309b are connected by bonding to the power-supply lines formed on a ceramic substrate. The currents to inject into the sections of the laser can be therefore controlled independently.

The contact resistance at each first electrode 308a and that at each second electrode 308b are 10 $\Omega$, so that the heat generated due to the contact resistances at the electrodes 308a and 308b is a great part of all heat generated when currents are injected to the sections of the laser. Each first electrode 308a is spaced from the active layer 303 by a distance shorter than the distance between each second electrode 308b and the active layer 303. Hence, the electrode 308a more greatly serve, than the electrode 308b, to change the temperature of the active layer 303 when the current injected to the section is varied.

To be more precise, the numbers of carriers injected into the active layer 303 is determined by the sum of the currents injected into one section from the electrodes 308a and 308b, whereas the temperature of the active layer 303 depends on not only the sum of said currents but also the ratio of one of these currents to the other. It follows that, in each section of the laser, the sum of the currents supplied from the electrodes 308a and 308b is changed, thereby controlling the carrier-density distribution along the length of the resonator, and also the ratio of the currents supplied from the electrodes 308a and 308b is changed, thereby controlling the temperature distribution along the length of the resonator. This makes it possible to control the distribution of the refractive index, independently of the carrier-density distribution within the resonator. As a result, the laser can stay in a stable oscillating state in any desired carrier-density distribution.

The operation of the fourth embodiment will now be explained, with reference to FIGS. 18A to 18D. FIGS. 18A to 18D illustrate the current distribution, the carrier-density distribution, the temperature distribution, and the refractive index distribution, respectively—all observed in the resonator of the laser shown in FIG. 14 when different currents are injected into the sections of the laser.

When a larger current is injected into the center section than into the end section, as is illustrated in FIG.

Figure 18A:
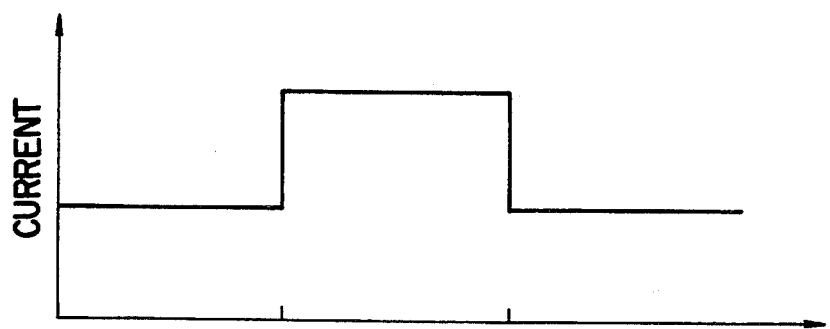
FIGS. 18A, 18B, 18C and 18D are graphs illustrating the current distribution, the carrier-density distribution, the temperature distribution, and the refractive-index distribution, respectively, all observed in the resonator of the semiconductor laser shown in FIG. 14.
Figure 18B:
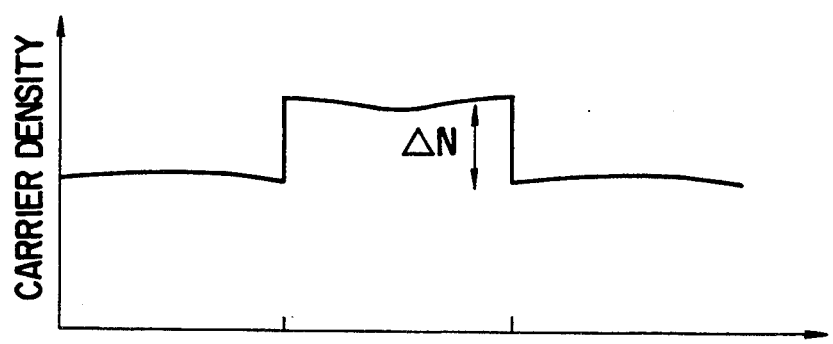
Figure 18C:
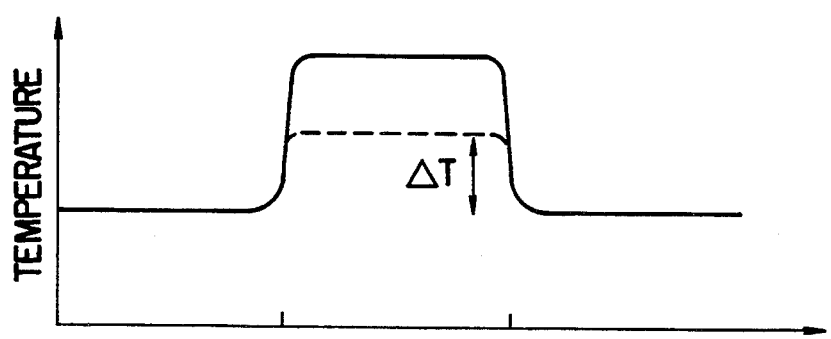
Figure 18D:
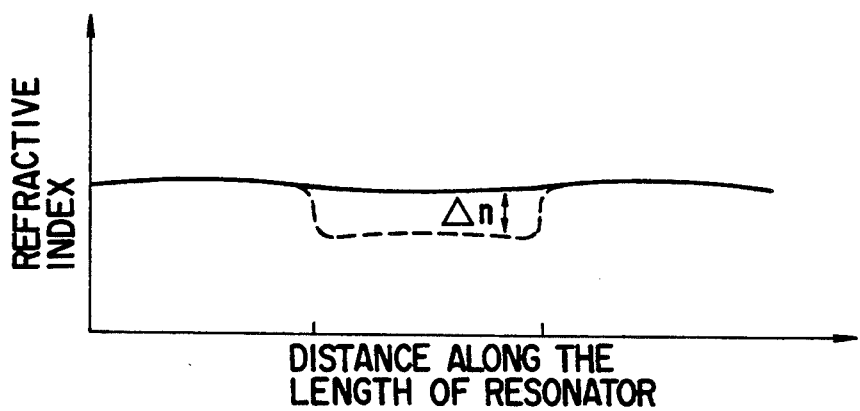
Figure 19:
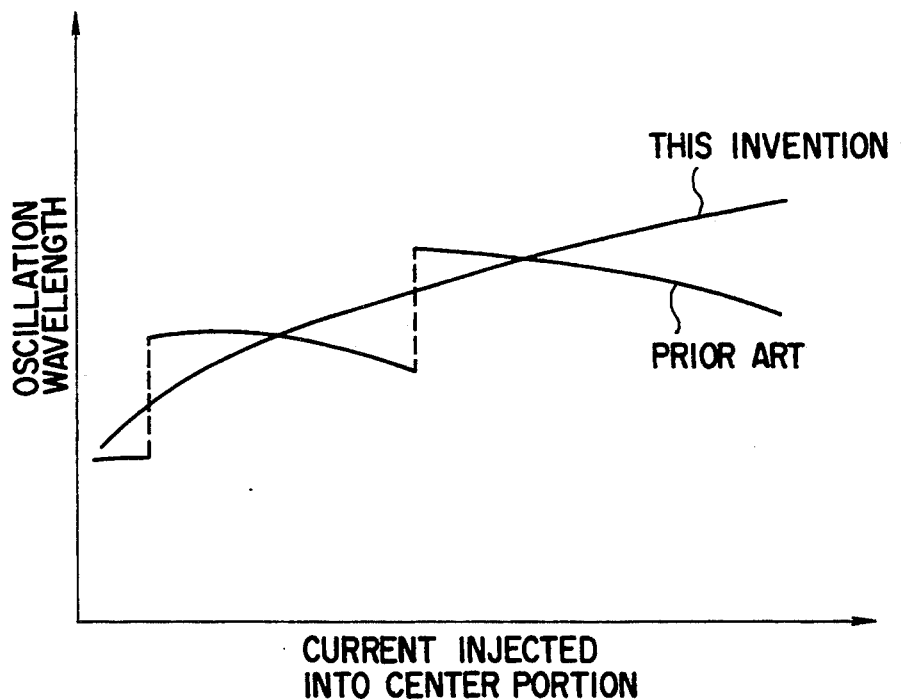
FIG. 19 is a graph representing the relationships between oscillation wavelength and injected current observed in the laser shown in FIG. 14 and the conventional three-electrode DFB semiconductor laser.

18A, the carrier density in the center section increases ΔN higher than in the end sections, as is evident from FIG. 18B. Simultaneously, the temperature of the center section rises ΔT above that of the end sections, as can be understood from FIG. 18C. The refractive index of each section increases in proportion to the temperature and in inverse proportion to the carrier density. Hence, the refractive index of the center section can be higher or lower than that of either end section, depending upon how much ΔN and ΔT influence the refractive index. How much ΔN and ΔT contribute to refractive index depends on not only the structure of the device, but also the bias currents injected into the electrodes 308a and 308b.

In a λ/4 phase-shifted DFB laser, for example, the difference Δn between the refractive index of the center section and that of either end section should be reduced below a certain value so that the layer may operate in the 0th-order mode. With the conventional three-electrode DFB laser, however, it is impossible to control the carrier-density distribution and the temperature distribution independently. Inevitably, such a difference in the refractive index Δn as would not cause mode jump from the 0th-order mode can be obtained but over a very narrow range in the conventional three-electrode DFB laser. Consequently, the conventional laser cannot be tuned over a broad wavelength range.

In the fourth embodiment of the present invention, the ratio between the currents injected from the first and second electrode 308a and 398b is changed, thereby changing the temperature of the active layer 303, without changing the number of carriers injected into the active layer 303. Hence, ΔN and ΔT can be controlled independently. The difference in the refractive index Δn can be obtained which falls within such a range as would not cause mode jump from the 0th-order mode, depending on neither the temperature characteristic nor bias current of the device.

More specifically, to increase the refractive index of the center section, it suffices to increase the current injected into the center section from either the first electrode 308a or the second electrode 308b, thereby to make the ratio between these currents greater. To decrease the refractive index of the center section, it suffices to decrease the ratio between these currents. In the case shown in FIGS. 18A to 18D, the current injected into the center section from the first electrode 308a is increased, raising the ratio of this current to the current injected from the second electrode 308b, thereby raising the temperature of the center section without altering the carrier-density distribution and, ultimately, distributing the refractive index uniformly in the center section. The laser according to the fourth embodiment can, therefore, remain in a stable oscillating state and can be tuned over a broad wavelength range without making a mode jump. Since the laser keeps on performing stable oscillation throughout its operation, the laser can have a narrow spectrum linewidth and can yet obtain a broad wavelength-tuning range.

The application of the present invention is not limited to the 0th-order mode operation of a λ/4 phase-shifted DFB laser. Rather, this invention is useful for the positive or negative first-order mode, and can be applied to a resonator which has no phase-shifting region. To operate the λ/4 phase-shifted DFB laser in either first-order mode or to operate a DFB laser having no phase-shifting region, too, it suffices to set the ratio between the currents injected into each section from the electrodes 308a and 308b at such a value that the difference in the refractive index Δn remains at such a value as to stabilize the desired oscillation mode.

Figure 20:
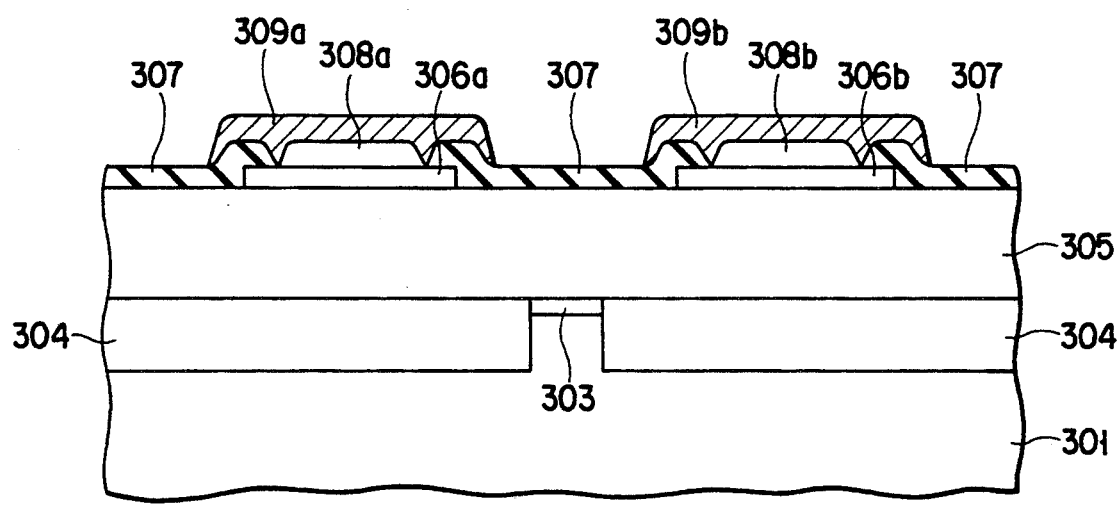
FIG. 20 is a sectional view, taken along a line perpendicular to the stripes of the active layer of a semiconductor laser according to a fifth embodiment of the present invention.

A multi-electrode DFB semiconductor laser which is a fifth embodiment of the invention will be described, with reference to FIG. 20. FIG. 20 is a sectional view, taken along a line perpendicular to the stripes of the active layer of the semiconductor laser. This laser is identical to the fourth embodiment, except that two electrodes 308a and 308b are provided, which have different contact resistances and which serve to inject different currents into the section to control the temperature change in the active layers of the laser.

The p-type InGaAs contact layers 306a and 306b have different p-type purity concentrations, and have different contact resistances, i.e., 10 Ω and 5 Ω, respectively. Thus, the electrode 308a formed on the contact layer 306a more contributes to the temperature change of the active layer than the electrode 308b which is formed on the contact layer 306b. The carrier-density distribution and the refractive index distribution, both in the resonator of the laser, can be independently controlled, merely by changing the sum of the currents injected into each section from the electrodes 308a and 308b and the ratio of one these currents to the other as in the fourth embodiment.

In each section of this laser, the electrodes 308a and 308b are spaced apart from the active layer 303 for the same distance. Instead, the electrode 308a may be located closer to the active layer 303 than the electrode 308b as in the fourth embodiment, the temperature can then be changed more greatly even if the ratio between the currents injected from the electrodes 308a and 308b remains unchanged.

A multi-electrode DFB semiconductor laser which is a sixth embodiment of the invention will be described, with reference to FIGS. 21 and 22. FIG. 21 is a plan view showing the general structure of the laser, and FIG. 22 is a sectional view, taken along a line perpendicular to the stripes of the active layer of the laser. In FIG. 21, the broken lines indicate where the stripes of the active layer are located.

As in the fourth embodiment, a diffraction grating 302 is formed beneath the active layer 303. A phase-shifting region 311 formed in the center portion of the diffraction grating 302. The region 311 corresponds to a quarter wavelength. Both faces of the laser, formed by cleaving, are coated with a $SiN_x$ film 312 having a reflectivity as low as 1% or less.

A $p^+$-type InP cladding layer 305a having a high Zn concentration is formed on the active layer 303. The active layer 303 and the cladding layer 305a are etched and shaped like a mesa. A semi-insulating p-type InP layer 304 is formed, embedding the mesa-shaped active layer 303 and the mesa-shaped cladding layer 301. A $p^-$-type InP cladding layer 305b having a low Zn concentration is formed on the semi-insulating p-type Inp layer 304. A p-type InGaAs contact layer 306 is formed on the InP cladding layer 305b. The contact layer 306 is divided by a $SiO_2$ insulating film 307 into a plurality of portions every electrodes.

A p-type ohmic electrode 308b is located right above the active layer 303, and p-type ohmic electrodes 308a are arranged on the both sides of the electrode 308b and spaced apart therefrom. Having a high Zn concentration, the cladding layer 305a has a low resistance, whereas the cladding layer 305b has a high resistance since its Zn concentration is low. Hence, each cladding layer 305b generates more heat than the cladding layer 305a. In other words, the heat generated in both cladding layers 305b is a greater part of all heat generated when the currents are injected to the laser.

The resistance between the active layer 303 and either electrode 308a is higher than the resistance between the active layer 303 and the electrode 308b. Hence, either ohmic electrode 308a more contributes to the temperature change of the active layer 303 than the ohmic electrode 308b. The carrier-density distribution and the refractive index distribution, both in the resonator of the laser, can be independently controlled, merely by changing the sum of the currents injected into each section from either electrodes 308a and 308b and the ratio of the current injected from electrode 308a to the current injected by the electrode 308b, as in the fourth and fifth embodiments described above.

How much the temperature of the active layer 303 changes is determined by the heat generated in the active layer 303, the heat generated at the contact portions between either electrode 308a and the layer 303 and between the electrode 308b and the layer 303, and the heat generated in those portions of the cladding layer 305 which are sandwiched between either electrode 308a and the layer 303 and between the electrode 398b and the layer 303. In the fourth embodiment, the heat generated at the cladding layer 305 is reduced to a minimum, the same amount of heat is generated at the contact portion between the the electrode 308a and the layer 303 and the contact portion between between the electrode 308b and the layer 303, and the electrodes 308a and 308b are located at different distances from the active layer 303. In the fifth embodiment, the heat generated at the cladding layer 305 is reduced to a minimum, the electrodes 308a and 308b are located at the same distance from the active layer 303, and different amounts of heat are generated at the contact portion between the electrode 308a and the layer 303 and the contact portion between the electrode 308b and the layer 303. In the sixth embodiment, the heat generated at the cladding layer 305 is reduced to a minimum, and the amount of heat generated at the cladding layer 305b is increased, thereby increasing the temperature change due to the ratio of the current injected from either electrode 308a to the current injected by the electrode 308b.

Figure 23:
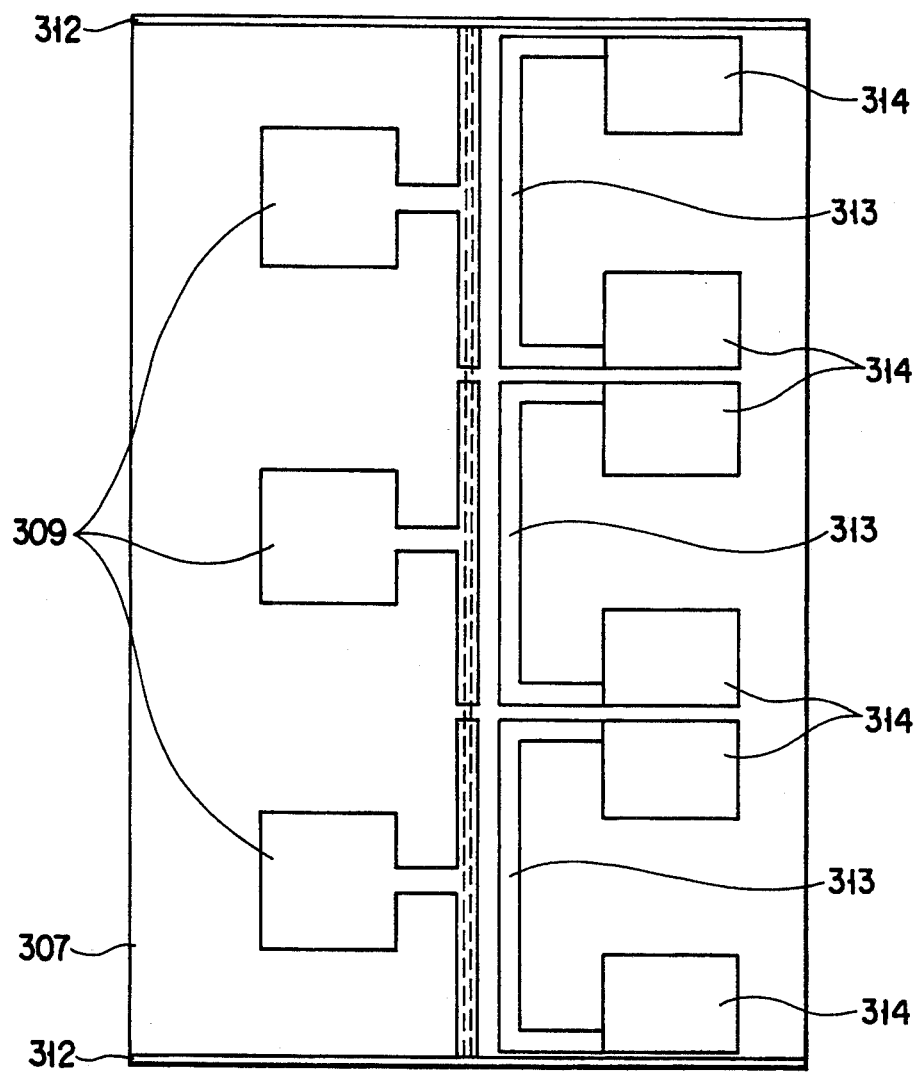
FIG. 23 is a plan view showing the general structure of a semiconductor laser according to a seventh embodiment of the present invention.
Figure 24:
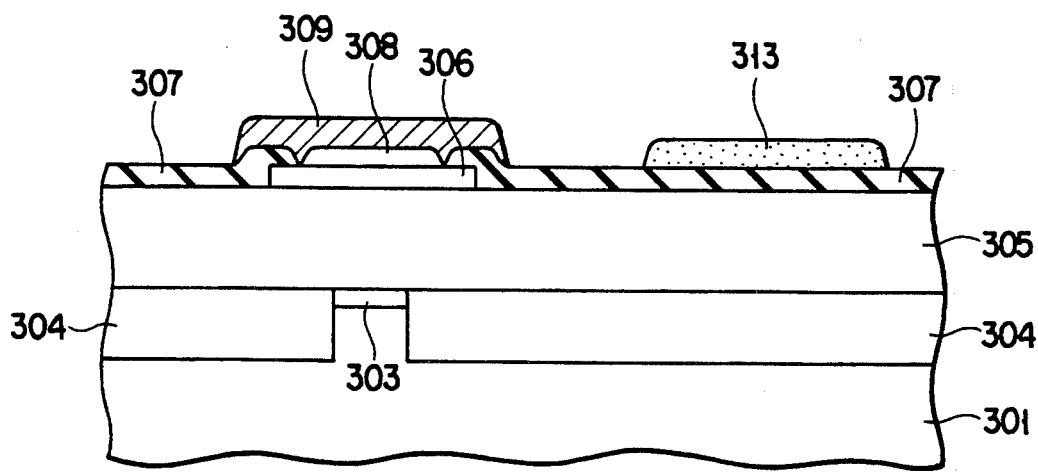
FIG. 24 is a sectional view, taken along a line perpendicular to the stripes of the active layer of the laser shown in FIG. 23.

A multi-electrode DFB semiconductor laser which is a seventh embodiment of the invention will be described, with reference to FIGS. 23 and 24. FIG. 23 is a plan view showing the general structure of a semiconductor laser, and FIG. 24 is a sectional view, taken along a line perpendicular to the stripes of the active layer of the laser. In FIG. 23, the broken lines indicate where the stripe of the active layer are located.

In the embodiments described above, the heat generated at the time of injecting currents into each section need not be utilized to control the carrier density distribution and the temperature distribution. Instead, another heating means may be employed. In each section of the seventh embodiment, a Pt resistive film 313 is formed in the vicinity of the stripes of the active layer, and electrode pads 314 are provided at the both ends of the film 313, respectively. A diffraction grating 302 is formed beneath the active layer 303, as in the fourth embodiment. A phase-shifting region 311 formed in the center portion of the diffraction grating 302. The phase-shifting region 311 corresponds to a quarter wavelength. Both faces of the laser, formed by cleaving, are coated with a SiN$_x$ film 312 having a reflectivity as low as 1% or less.

With the seventh embodiment, it suffices to change the current injected from an electrode 308 into each section in order to control the carrier-density distribution along the length of the resonator, and to change the current supplied to the resistive film 313 in order to control the temperature distribution along the length of the resonator. The carrier-density distribution and the refractive index distribution can, therefore, be controlled independently of each other.

Figure 25:
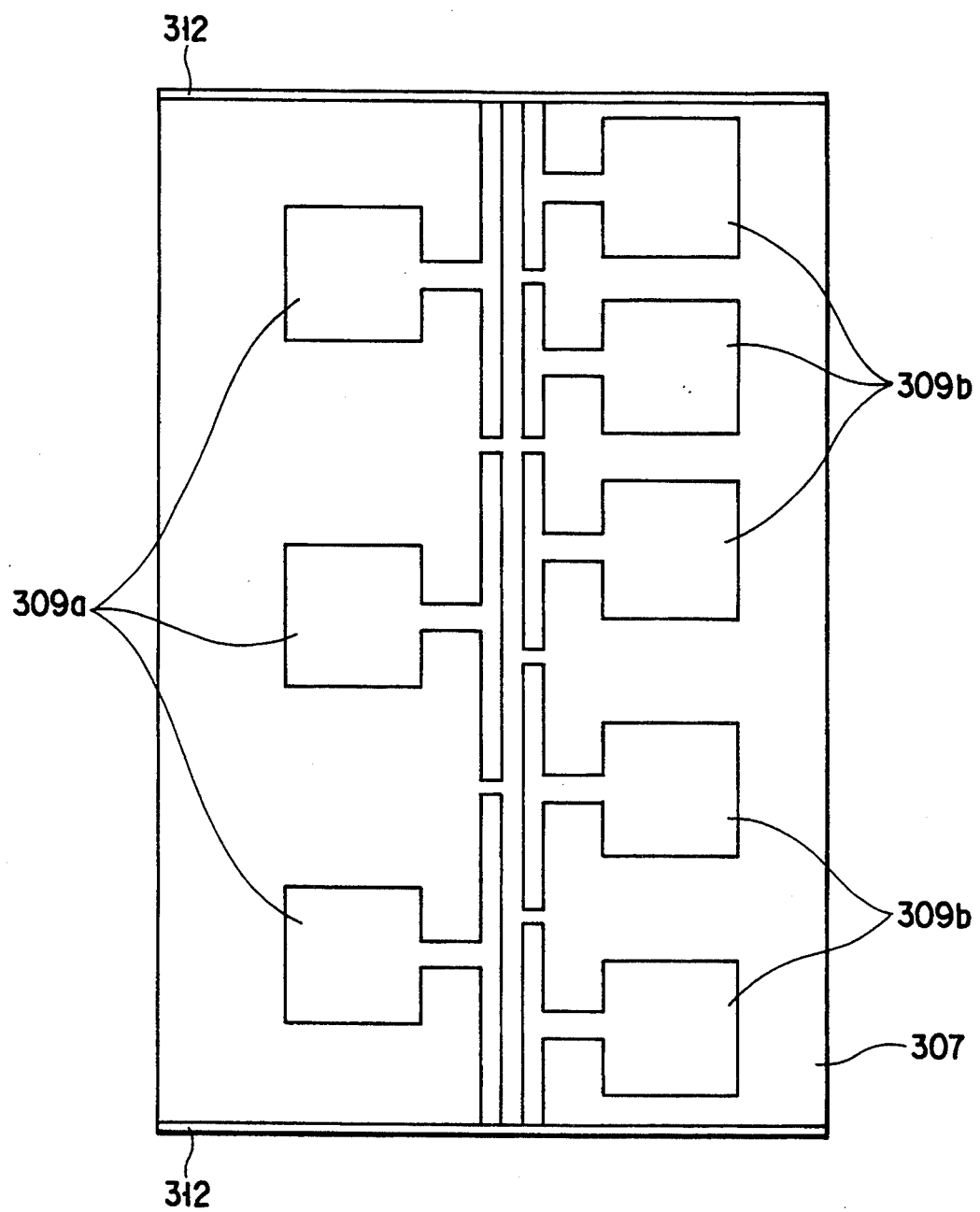
FIG. 25 is a plan view showing the general structure of a semiconductor laser according to an eighth embodiment of the present invention.

A plurality of electrodes which differently serve to change the temperature of the active, or a single electrode and heating means need mot provided in every section, as in any embodiment described above. In other words, the electrodes or a single electrode and heating means may be incorporated in a part of the sections. Further, electrodes 308a and 308b need not be arranged in pairs; for example, one electrode 308a may be provided for every two electrodes 308b as is illustrated in FIG. 25. The same holds true of the electrode 308 and the heating means 313. Furthermore, according to the present invention, it is possible to incorporate electrodes located at different distances from an active layer into one section of a laser, to use electrodes having different contact resistances in another section of the laser, and to utilize the heat generated at an InP cladding layer in still another section of the laser.

The present invention is not limited to the embodiments described above and shown in the accompanying drawings. Each embodiment is an InGaInAs wavelength-tunable laser. Nevertheless, this invention can be applied to wavelength-tunable lasers made of various materials such as InGaAlAs, AlGaInAs, AlGaInP, InGaAsSb, ZnCdSSe, and the like. The substrate used in the invention is not limited to an n-type one. The laser structure extending in a plane perpendicular to the length of the resonator is not limited to one embedded in a semi-insulating film. Nor is the active layer limited to a quantum well active layer. Furthermore, the diffraction grating need not extend throughout the resonator; it may provided in the end sections only.

The embedded laser structure is not limited to BH type or the above-mentioned SACM type. In addition, the laser according to the present invention can be so modified as to be integrated with other elements or to form an array with other elements.

As has been described in detail, in the present invention, the temperature changes greatly in the first section of the DFB resonator and little in the second section thereof, because of the changes in the currents injected into these sections. The mutual cancellation of carrier effect and heat effect is therefore suppressed. Hence, the laser of this invention can be turned continuously over a broader wavelength range than the conventional DFB laser.

The laser according to the invention has means for controlling carrier-density distribution and temperature distribution along the length of the resonator, independently of each other. The laser can, therefore, remain in stable oscillating state for any given carrier-density distribution, and attains a broad wavelength tunability.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A wavelength-tunable semiconductor laser comprising:
   a semiconductor substrate having first and second major surfaces;
   a distributed-feedback resonator having an active layer and a cladding layer, formed on the first major surface of said substrate and shaped like a stripe, said resonator being divided into a first section and a second section aligned along the length of the resonator;
   first and second electrodes formed on the first and second sections of said resonator, respectively, for controlling current densities in the first and the second section independently, temperature changing more in said first section than in said second section, due to changes in densities of currents injected into said first and second sections, wherein said first and second sections are so designed such that a thermal resistance in said first section is higher than that in said second section; and
   a third electrode formed on the second major surface of said semiconductor substrate.

2. The laser according to claim 1, wherein said first section has a mesa-shaped cross-section taken along a plane perpendicular to said resonator, and said second section has a mesa-shaped or planar cross-section taken along said plane and larger than the cross-section of said first section.

3. The laser according to claim 1, further comprising a heat sink formed on the second major surface of said substrate, a first layer sandwiched between said first section and said heat sink, and not sandwiched between said second section and said heat sink, and made of material having a thermal conductivity lower than that of a corresponding portion of said second section.

4. The laser according to claim 1, wherein said first section has a thermal resistance at least 30% higher than that of said second section.

5. A wavelength-tunable semiconductor laser comprising:
   a semiconductor substrate having first and second major surfaces;
   a distributed-feedback resonator having an active layer and a cladding layer, formed on the first major surface of said substrate and shaped like a stripe, said resonator being divided into a first section and a second section aligned along the length of the resonator;
   first and second electrodes formed on the first and second sections of said resonator, respectively, for controlling current densities in the first and the second section independently, temperature changing more in said first section than in said second section, due to changes in densities of current injected into said first and second sections;
   a first current path for supplying a current to the active layer of said first section and a second current path for supplying a current to the active layer of said second section, at least one portion of said first current path having an electric resistance higher than that of a corresponding portion of said second current path; and
   a third electrode formed on the second major surface of said semiconductor substrate.

6. The laser according to claim 5, wherein said at least one portion of said first current path differs in dopant concentration, thickness, width or composition from the corresponding portion of said second current path and is thereby made more electrically resistant than the corresponding portion of said second current path.

7. The laser according to claim 6, wherein said first section has a differential resistance at least two times higher than the differential resistance of said second section which is 5 $\Omega$ at most.

8. A wavelength-tunable semiconductor laser comprising:
   a semiconductor substrate having first and second major surfaces;
   a distributed-feedback resonator having an active layer and a cladding layer, formed on the first major surface of said substrate and shaped like a stripe, said resonator being divided into a first section and a second section aligned along the length of the resonator;
   first and second electrodes formed on the first and second sections of said resonator, respectively, for controlling current densities in the first and the second section independently, temperature changing more in said first section than in said second section, due to changes in densities of current injected into said first and second section, wherein said first section and said second section are designed such that an ineffective current flowing in said first section is larger than an ineffective current flowing in said second section; and
   a third electrode formed on the second major surface of said semiconductor substrate.

9. The laser according to claim 8, further comprising a buried layer contacting a side of said active layer, in which a larger leakage current is forced to flow at said first section than at said second section.

10. The laser according to claim 8, wherein carrier density changes due to a change in the density of a current flowing through said active layer, more greatly in said second section than in said first section.

11. The laser according to claim 8, wherein carrier lifetime is shorter in the active layer of said first section than in the active layer of said second section.

12. The laser according to claim 11, wherein the carrier lifetime in the active layer of said first section is shortened due to an impurity doped in the active layer of said first section.

13. The laser according to claim 8, wherein a ratio of electrons overflowing said active layer to all electrons injected into said active layer is higher in said first section than in said second section.

14. A wavelength-tunable semiconductor laser comprising:
   a semiconductor substrate;
   a stripe-shaped active layer formed on said substrate;
   a diffraction grating extending along said stripe-shaped active layer;
   a plurality of split electrodes arranged along said stripe-shaped active layer, at least one of said split electrodes including first and second electrodes spaced apart from each other, said first and second electrodes being in a plane perpendicular to a direction of said stripe-shaped active layer, and a change in current injected into said first electrode per unit length of the stripe-shaped active layer causing a change in temperature of said active layer differing from a change in temperature of the stripe-shaped active layer due to a change in current injected into said second electrode per unit length of the stripe-shaped active layer, wherein said first electrode and said second electrode are spaced apart from said stripe-shaped active layer at different distances; and a third electrode formed on a surface of the substrate opposite to the first electrodes and the second electrodes.

15. A wavelength-tunable semiconductor laser comprising:

a semiconductor substrate;

a stripe-shaped active layer formed on said substrate;

a diffraction grating extending along said stripe-shaped active layer;

a plurality of split electrodes arranged along said stripe-shaped active layer, at least one of said split electrodes including first and second electrodes spaced apart from each other, said first and second electrodes being in a plane perpendicular to a direction of said stripe-shaped active layer, and a change in current injected into said first electrode per unit length of the stripe-shaped active layer causing a change in temperature of said active layer differing from a change in temperature of said active layer due to a change in current injected into said second electrode per unit length of the stripe-shaped active layer, wherein a resistance between said first electrode and said stripe-shaped active layer is different from a resistance between said second electrode and said stripe-shaped active layer; and a third electrode formed on a surface of the substrate opposite to the first electrodes and the second electrodes.

* * * * *